(12) United States Patent
Hashimoto et al.

(10) Patent No.: US 7,675,161 B2
(45) Date of Patent: Mar. 9, 2010

(54) SEMICONDUCTOR DEVICE WITH WIRINGS HAVING VARYING LENGTHS

(75) Inventors: Koji Hashimoto, Yokohama (JP); Eiji Ito, Kawasaki (JP); Tetsuya Kamigaki, Yokohama (JP); Hideyuki Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 934 days.

(21) Appl. No.: 11/317,028

(22) Filed: Dec. 27, 2005

(65) Prior Publication Data
US 2006/0194429 A1    Aug. 31, 2006

(30) Foreign Application Priority Data
Dec. 27, 2004  (JP)  ............................ 2004-378179

(51) Int. Cl.
   H01L 23/12     (2006.01)
   H01L 21/4763   (2006.01)
   H05K 1/11      (2006.01)

(52) U.S. Cl. ................ 257/700; 257/773; 257/776; 257/E23.152; 174/261; 438/622

(58) Field of Classification Search .................. None
See application file for complete search history.

(56) References Cited

U.S. PATENT DOCUMENTS

| 5,482,885 | A | 1/1996 | Lur et al. |
| 5,946,195 | A * | 8/1999 | Hashimoto .................. 361/774 |
| 6,063,688 | A | 5/2000 | Doyle et al. |
| 6,262,487 | B1 * | 7/2001 | Igarashi et al. ............... 257/758 |
| 6,469,255 | B2 * | 10/2002 | Watanabe et al. ........... 174/254 |
| 6,475,891 | B2 | 11/2002 | Moon |
| 6,638,441 | B2 | 10/2003 | Chang et al. |
| 6,703,312 | B2 | 3/2004 | Golz et al. |
| 7,023,094 | B2 * | 4/2006 | Suga .......................... 257/774 |

* cited by examiner

Primary Examiner—Alonzo Chambliss
(74) Attorney, Agent, or Firm—Finnegan, Henderson, Farabow, Garrett & Dunner, L.L.P.

(57) ABSTRACT

A semiconductor device comprising a plurality of first wirings provided in a predetermined layer on a substrate with being lined up, and formed to extend longer or contract shorter from one side toward the other side along a direction in which the first wirings are lined up, adjacent one-end portions of the first wirings being arranged in positions displaced from one another in a direction crossing at right angles the direction in which the first wirings are lined up.

10 Claims, 28 Drawing Sheets

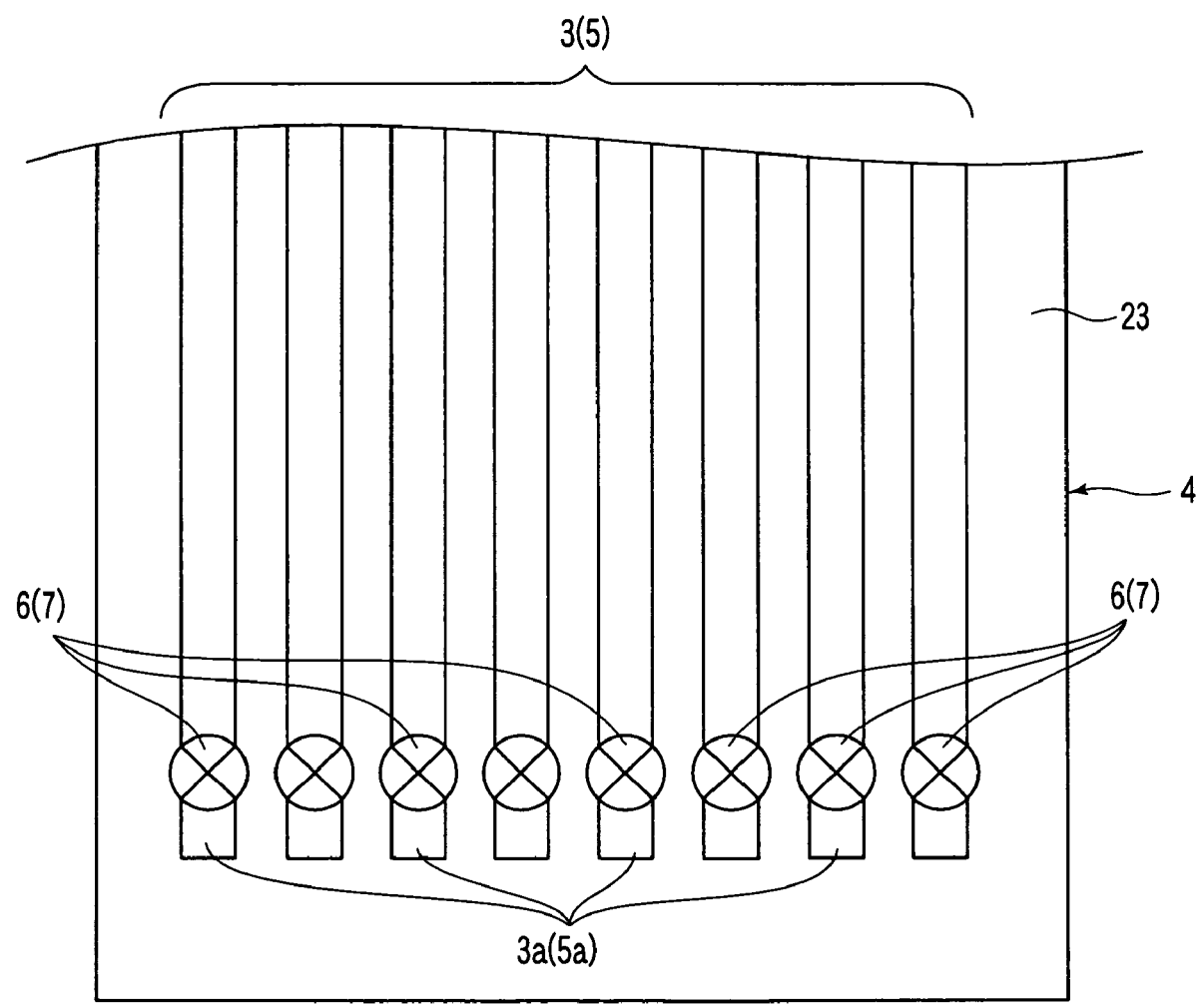
F I G. 6

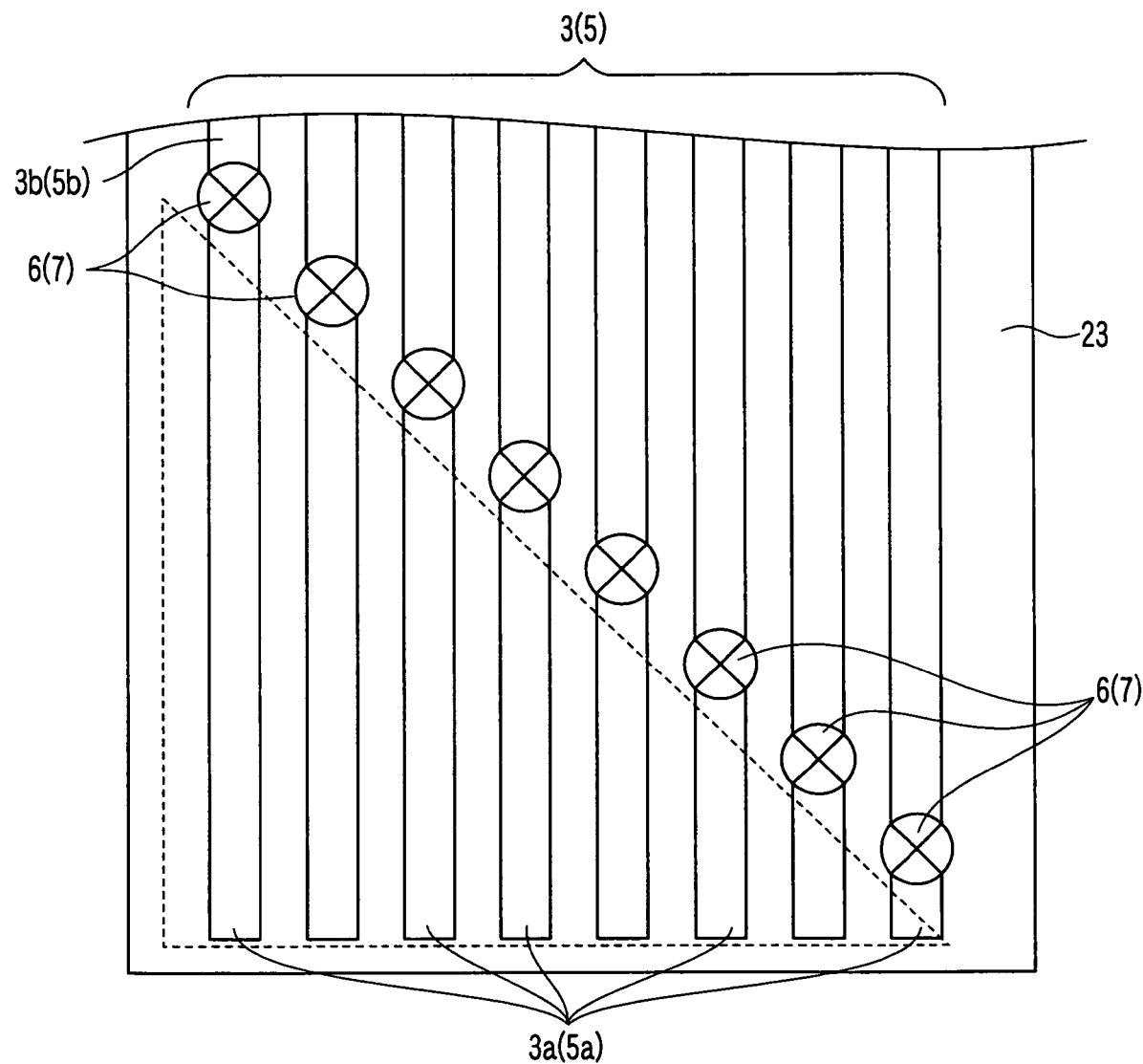
F I G. 7

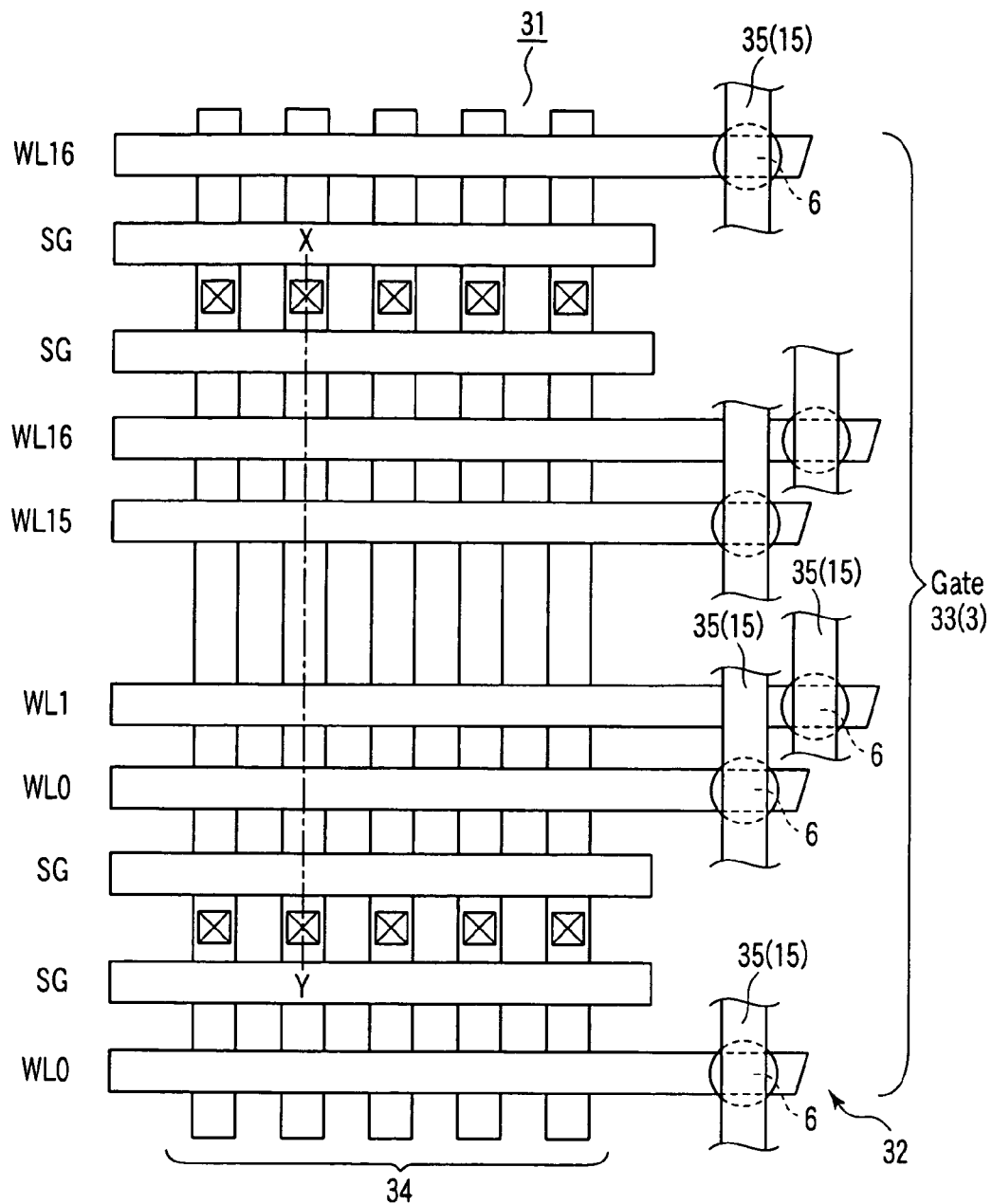
F I G. 29A
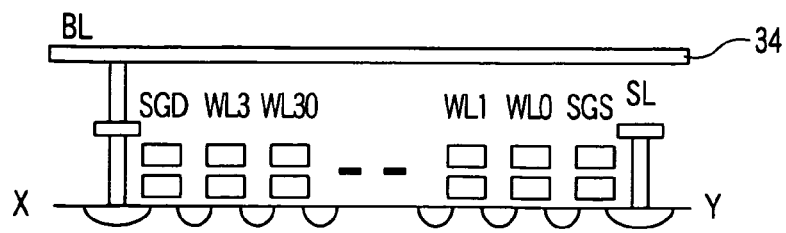
F I G. 29B

SEMICONDUCTOR DEVICE WITH WIRINGS HAVING VARYING LENGTHS

CROSS-REFERENCE TO RELATED APPLICATIONS

This application is based upon and claims the benefit of priority from prior Japanese Patent Application No. 2004-378179, filed on Dec. 27, 2004, the entire contents of which are incorporated herein by reference.

BACKGROUND OF THE INVENTION

1. Field of the Invention

The present invention relates to a wiring pattern of a semiconductor device, more particularly to a semiconductor device and a method of manufacturing the device in which a wiring pattern and the like are improved.

2. Description of the Related Art

In recent years, miniaturization and high integration of an inner structure of a semiconductor, and compactification of the semiconductor device have been remarkable. To meet these requirements, there have been developed a large number of various resolution enhancement technologies (RET) for forming a pattern which is fine as compared with a wavelength of a light source in, for example, a lithography process as one of processes of manufacturing the semiconductor device since the latter half of 1980s. Moreover, in this RET, for example, a transformation illumination technology has been broadly put to practical use, because a depth of focus (DOF) of a period pattern can be largely improved by comparatively simply changing an optical system. However, in recent years, reduction of the wavelength of a light source (exposure ray) or increasing of a numerical aperture (NA) of a lens cannot catch up with a request for miniaturization of a semiconductor device which has acceleratingly advanced. Specifically, it has been requested that a pattern be formed which has a pattern pitch finer than a minimum pattern pitch formable by a usual lithography technology. As one of such fine pattern forming technologies, a pattern forming technology by a so-called side-wall leaving process (side-wall transfer process) is disclosed in, for example, U.S. Pat. Nos. 5,482,885, 6,475,891 B2, 6,638,441 B2, 6,703,312 B2 and the like. There will be briefly described hereinafter the fine pattern forming method using this side-wall leaving process (not shown).

First, a resist pattern is formed on a first film composing a dummy pattern by a lithography process. Subsequently, the first film is etched using this resist pattern as a mask to form the dummy pattern. After forming the dummy pattern, the resist pattern is peeled off. Next, a second film as a material of a side wall is deposited on the dummy pattern. Thereafter, the second film is etched by, for example, a reactive ion etching (RIE) process to thereby form a foundation of a design pattern as an actual pattern on the side wall of the dummy pattern. Subsequently, after peeling the dummy pattern, a film to be worked as a substrate film is etched using the side wall as a mask. In this case, a hard mask is selected as the film to be worked, and the hard mask can be slimmed to form a finer design pattern. Moreover, when the side wall is finally peeled, the pattern formation by the side wall leaving process is ended. Accordingly, the fine design pattern is completed. It is to be noted that when the hard mask is used as the film to be worked, the hard mask is peeled after etching the film to be worked. For example, there are the following characteristics of such side-wall leaving process.

First, a pitch of the pattern formed by the lithography process may be twice a design pitch. That is, it is sufficiently possible to form a fine pattern even with an exposure device two or three generations before. The design pattern is different from a lithography target pattern (dummy pattern). The pattern can be formed into an equal pattern size on the whole surface of a substrate. The formed pattern is a closed loop pattern. Since a dimensional precision of the formed pattern is determined by an only film thickness of a side-wall material, dimension controllability is high. Furthermore, a line edge roughness of the formed pattern is small.

Among these several characteristic respects of the side-wall leaving process, the characteristic that the formed pattern becomes the closed loop pattern is a disadvantage of the side-wall leaving process. If the closed loop pattern is left as such, it is virtually impossible to complete a wiring pattern of a memory cell owing to a restriction on an inner structure, for example, in a general memory device among various semiconductor devices. Therefore, to complete the wiring pattern of the memory cell, the closed loop pattern has to be cut somewhere. That is, a step of cutting the closed loop pattern is further required. When the wiring pattern of the memory device is formed by this side-wall leaving process, the wiring pattern has to be drawn from a memory cell portion out to a peripheral circuit. However, as a result of checking by the present inventors, an effective drawing method has not been proposed yet.

Moreover, not only the wiring pattern of the memory cell formed by the side-wall leaving process but also a plurality of wiring patterns are densely formed in the same layer in the general semiconductor device. Furthermore, contact portions for electrically connecting each wiring pattern to another upper or lower wiring pattern is provided in a terminal end portion of each wiring pattern. Usually, the respective wiring patterns are cut so that the terminal end portions are linearly arranged and positioned along a direction crossing a longitudinal direction of each wiring pattern at right angles. Therefore, contact portions of the respective wiring patterns are linearly arranged along the direction crossing the longitudinal direction of each wiring pattern at right angles. However, in such structure, if misalignment is generated between each wiring and each contact plug in providing the contact plugs on the respective wirings, there is a high possibility that adjacent wirings short-circuit via the contact plugs.

To prevent such possibility beforehand, there is considered a technology to enlarge latitude (margin) of the misalignment between each wiring and each contact plug. For example, the respective contact portions are linearly arranged along a direction obliquely crossing the longitudinal direction of each wiring pattern on each wiring pattern. Accordingly, in each contact portion, it is possible to enlarge the latitude of the misalignment between each wiring and each contact plug with respect to at least the direction crossing the longitudinal direction of each wiring pattern at right angles. However, in this method, a tip portion of the wiring pattern from the contact portion becomes useless in the wiring pattern whose start end portion or intermediate portion is provided with the contact portion. Additionally, a whole tip area of each wiring pattern from the contact portion is formed as an unnecessary area for a circuit in an area of the substrate on which each wiring pattern is provided excluding an area in which a wiring pattern provided with the contact portion in its terminal end portion is formed. That is, a dead space (area penalty) of the substrate enlarges. Therefore, when the respective contact portions are simply arranged along the direction obliquely crossing the longitudinal direction of each wiring pattern, there is a remarkably high possibility that the further miniaturization, high integration, and compactification of the semiconductor device are hindered.

BRIEF SUMMARY OF THE INVENTION

According to an aspect of the invention, there is provided a semiconductor device comprising: a plurality of first wirings provided in a predetermined layer on a substrate with being lined up, and formed to extend longer or contract shorter from one side toward the other side along a direction in which the first wirings are lined up, adjacent one-end portions of the first wirings being arranged in positions displaced from one another in a direction crossing at right angles the direction in which the first wirings are lined up.

According to another aspect of the invention, there is provided a manufacturing method of a semiconductor device, comprising: providing a plurality of linear patterns composed of a second film with lining up apart from one another along a direction intersecting with a longitudinal direction of each pattern on the surface of a first film provided above a substrate to be processed; providing a plurality of side-wall films individually to cover side portions of the respective linear patterns on the surface of the first film; remaining the respective side-wall films with lining up apart from one another on the surface of the first film by removing the second film from the surface of the first film; providing a resist film on the surface of the first film to cover each side-wall film on the surface of the first film while exposing a part of each side-wall film so that an area of the surface of each side-wall film covered with the resist film is enlarged or reduced from one side toward the other side along a direction in which the respective side-wall films are lined up and that boundary portions between areas of the respective side-wall films covered with the resist film and areas of the respective side-wall films exposed from the resist film are displaced from each other between the respective side-wall films provided adjacent in a direction crossing at right angles the direction in which the respective side-wall films are lined up; removing the resist film from the surface of the first film after removing a part of each side-wall film exposed from the resist film from the surface of the first film by use of the resist film as a mask; and forming a plurality of first wirings composed of predetermined patterns by removing the first film exposed from each side-wall film by use of each side-wall film left on the surface of the first film as a mask.

BRIEF DESCRIPTION OF THE SEVERAL VIEWS OF THE DRAWING

FIG. 6 is a plan view showing the first comparative example with respect to the third embodiment;

FIG. 7 is a plan view showing a second comparative example with respect to the third embodiment;

FIG. 29A is a plan view showing a method of manufacturing a semiconductor device in an eighth embodiment;

FIG. 29B is a sectional view taken along broken line X-Y in FIG. 29A; and

DETAILED DESCRIPTION OF THE INVENTION

Embodiments of the present invention will be described hereinafter with reference to the drawings.

First Embodiment

Figure 1:
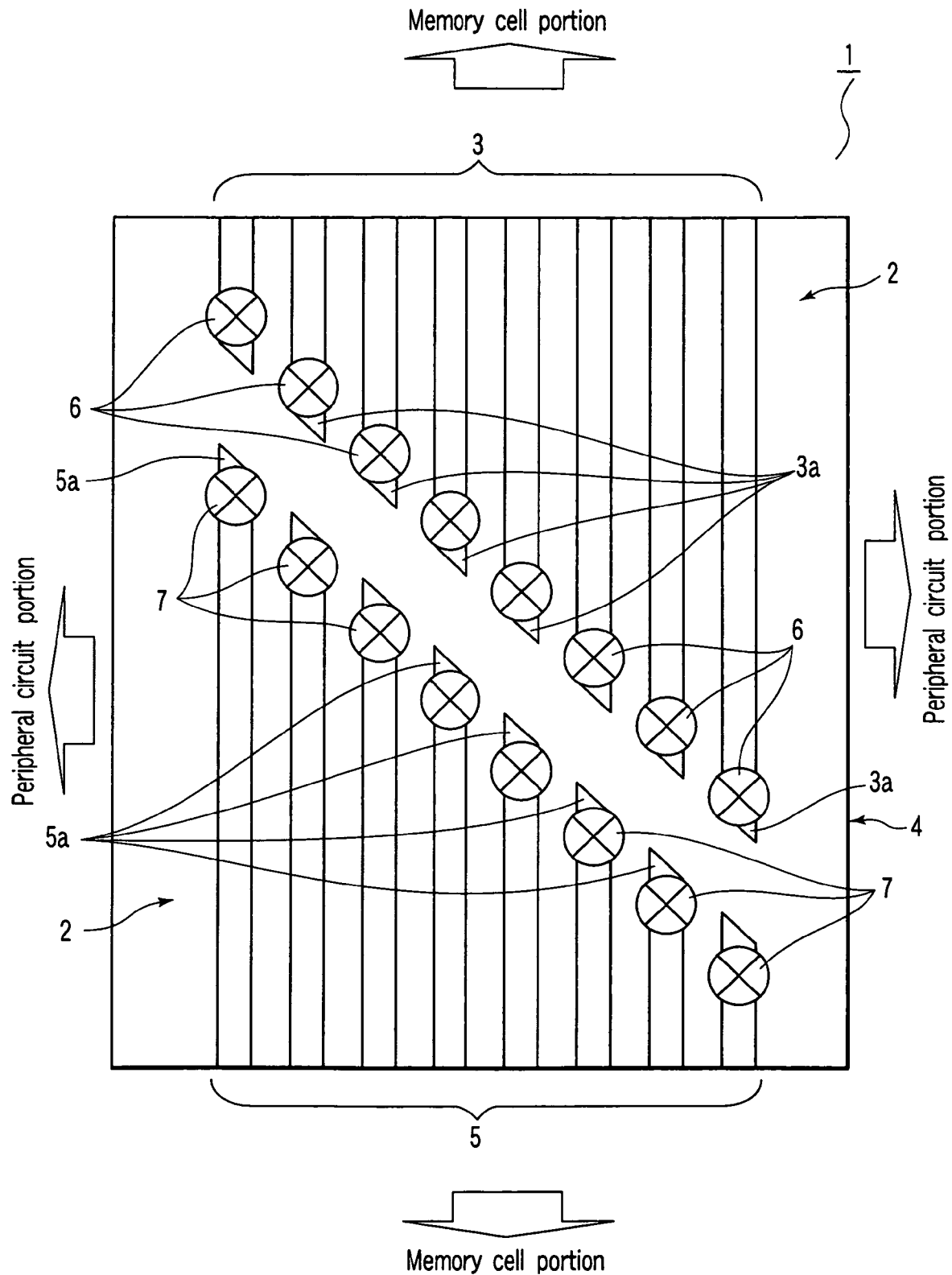
FIG. 1 is a plan view showing a semiconductor device in a first embodiment.

First, a first embodiment of the present invention will be described with reference to FIG. 1. FIG. 1 is a plan view showing a semiconductor device in the present embodiment.

In the present embodiment, there will be described a semiconductor device provided with wirings composed of a pattern in which a pattern pitch is finer than that formed in a usual lithography process and in which a latitude (alignment margin) for misalignment with respect to a contact portion is enhanced and whose useless space (area penalty) is small.

FIG. 1 shows a wiring pattern 2 of an integrated circuit present in a semiconductor device 1 according to the present embodiment. As shown in FIG. 1, in the semiconductor device 1 of the present embodiment, each lower-layer wiring pattern 3 as a first wiring drawn out of a memory cell portion (not shown) is formed to extend longer or contract shorter from one side toward the other side along a direction in which the patterns are arranged, and a plurality of patterns are provided in a predetermined layer of a semiconductor substrate 4. Moreover, terminal end portions 3a each of which is one end portion of each of the respective adjacent lower-layer wiring patterns 3 are provided in mutually displaced positions in a direction crossing the direction in which the respective lower-layer wiring patterns 3 are arranged. That is, the terminal end portions 3a of the respective lower-layer wiring patterns 3 are arranged on the respective lower-layer wiring patterns 3 in the positions displaced from one another along the longitudinal direction of each lower-layer wiring pattern 3 so that the terminal end portions do not overlap with one another in a direction crossing the longitudinal direction of each lower-layer wiring pattern 3 at right angles. To be more specific, the terminal end portions 3a of the lower-layer wiring patterns 3 are formed to be linearly arranged along a direction obliquely crossing the longitudinal direction of each lower-layer wiring pattern 3.

Moreover, as shown in FIG. 1, the wiring pattern 2 composed of a plurality of second wirings 5 different from the first wirings is provided in the same layer as the layer provided with the first wirings 3 of the semiconductor device 1. These respective lower-layer wiring patterns 5 as the respective second wirings are formed in the same manner as in the respective lower-layer wiring patterns 3. That is, each lower-layer wiring pattern 5 drawn out of a memory cell portion (not shown) is formed to extend longer or contract shorter from one side toward the other side along a direction in which the patterns are arranged, and is provided in the same layer as that of each lower-layer wiring pattern 3. Moreover, terminal end portions 5a each of which is one end portion of each of the respective adjacent lower-layer wiring patterns 5 are provided in mutually displaced positions in a direction crossing the direction in which the respective lower-layer wiring patterns 5 are arranged. That is, the terminal end portions 5a of the respective lower-layer wiring patterns 5 are arranged on the respective lower-layer wiring patterns 5 in the positions displaced from one another along the longitudinal direction of each lower-layer wiring pattern 5 so that the terminal end portions do not overlap with one another in a direction crossing the longitudinal direction of each lower-layer wiring pattern 5 at right angles. To be more specific, the terminal end portions 5a of the respective lower-layer wiring patterns 5 are formed to be linearly arranged along a direction obliquely crossing the longitudinal direction of each lower-layer wiring pattern 5.

It is to be noted that in the present embodiment, each lower-layer wiring pattern 5 forms a pair with each lower-layer wiring pattern 3, and is extended along a direction parallel to the longitudinal direction of each lower-layer wiring pattern 3. Moreover, the terminal end portion 5a of each lower-layer wiring pattern 5 is provided facing the terminal end portion 3a of each lower-layer wiring pattern 3 at a predetermined interval. In the present embodiment, all of the intervals between the terminal end portions 5a of the respective lower-layer wiring patterns 5 and the terminal end portions 3a of the respective lower-layer wiring patterns 3 are set to be equal. Therefore, in the present embodiment, the pairs of the terminal end portions 5a of the respective lower-layer wiring patterns 5 and the terminal end portions 3a of the respective lower-layer wiring patterns 3 are arranged linearly along a direction obliquely crossing the longitudinal directions of each lower-layer wiring pattern 5 and each lower-layer wiring pattern 3.

Moreover, the terminal end portion 3a of each lower-layer wiring pattern 3 is provided with each first contact hole pattern (first contact plug) 6 as a first contact portion which electrically connects each lower-layer wiring pattern 3 to each of a plurality of upper-layer wirings (not shown) provided in an upper layer of the layer in which each lower-layer wiring pattern 3 is provided. Similarly, the terminal end portion 5a of each lower-layer wiring pattern 5 is provided with each second contact hole pattern (second contact plug) 7 as a second contact portion which electrically connects each lower-layer wiring pattern 5 to each of a plurality of other upper-layer wirings (not shown) provided in an upper layer of the layer in which each lower-layer wiring pattern 5 is provided. Needless to say, the respective first contact plugs 6 and the respective second contact plugs 7 are also linearly arranged along a direction obliquely crossing the longitudinal directions of the respective lower-layer wiring patterns 3 and 5.

As described above, the respective lower-layer wiring patterns 5 and 3 are electrically connected to the respective upper-layer wirings (upper-layer wiring patterns) (not shown) via the first and second contact plugs 6 and 7. Although not shown, terminal end portions each of which is one end portion of each upper-layer wiring pattern are arranged linearly along the direction obliquely crossing the longitudinal direction of each upper-layer wiring pattern. Moreover, each upper-layer wiring pattern is electrically connected to a peripheral circuit portion (core portion) (not shown). Therefore, the respective lower-layer wiring patterns 3 and 5 drawn out of the memory cell portion are drawn out to the peripheral circuit portions and electrically connected to the upper layer on the layer provided with the lower-layer wiring patterns via the respective first and second contact plugs 6 and 7 and the respective upper-layer wiring patterns.

As described above, according to the first embodiment, since the respective lower-layer wiring patterns 3 and 5 are formed into the above-described wiring patterns, latitude (positioning margins) can be enlarged in positioning the respective lower-layer wiring patterns 3 and 5 and the respective first and second contact plugs 6 and 7. Moreover, there is hardly a possibility that an unnecessary dead space is formed especially in a portion of the substrate 4 drawn out of the memory cell portion, and an area penalty can be largely reduced. That is, substantially the whole surface of the semiconductor substrate 4 can be effectively utilized as a wiring forming area. It is to be noted that the effective usability of the space on this substrate will be described later in a third embodiment with reference to FIGS. 5 to 7.

As described above, in the semiconductor device 1 of the first embodiment, the wiring pattern is improved, and drawing properties of the wirings are enhanced regardless of a size of the wiring to be formed or a pitch between the wirings. Moreover, a possibility that an electric problem such as short-circuit between the wirings occurs is suppressed, and an area in which the wirings are formed is space-saved. Therefore, the semiconductor device 1 of the present embodiment can sufficiently cope with further miniaturization, high integration, and compactification. Specifically, according to the semiconductor device 1 having the above-described wiring pattern, it is possible to manufacture an LSI adaptable to the further miniaturization, high integration, and compactification.

Second Embodiment

Figure 2:
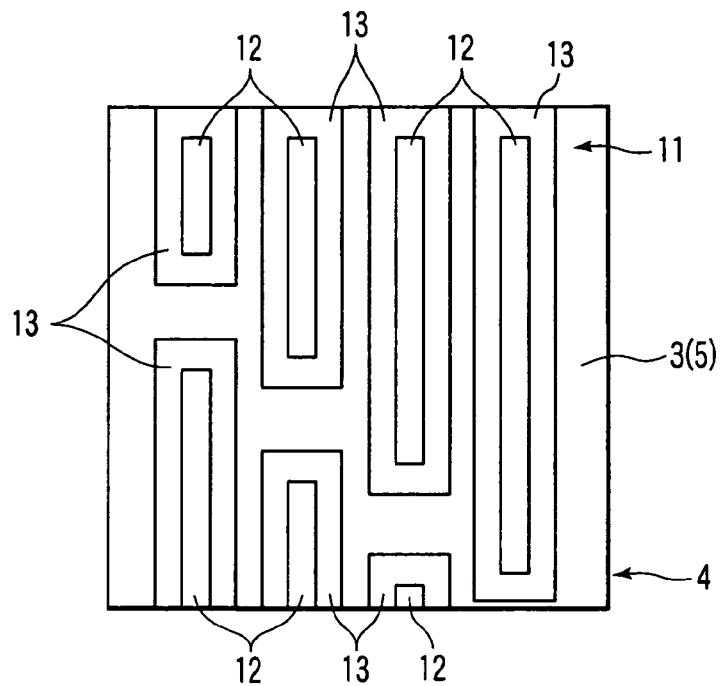
FIG. 2 is a plan view showing a method of manufacturing a semiconductor device in a second embodiment.
Figure 3:
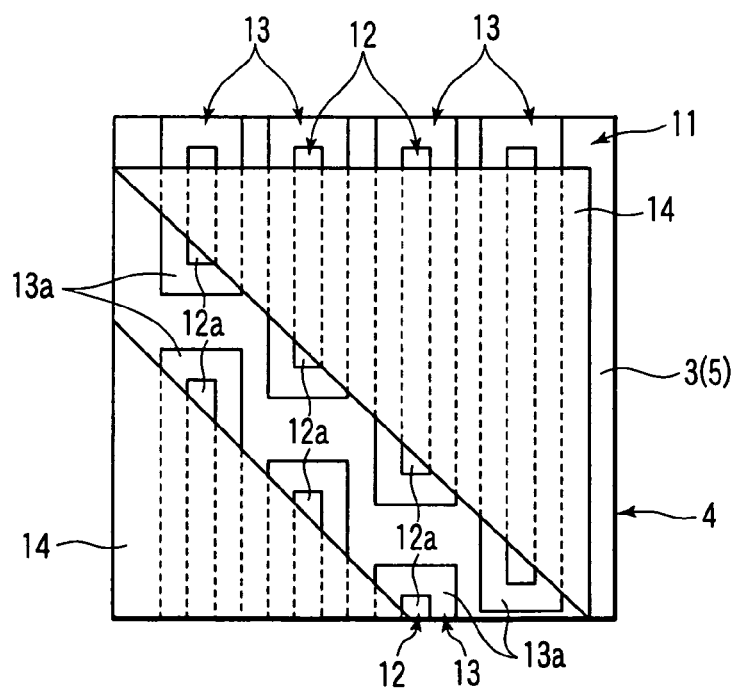
FIG. 3 is a plan view showing a method of manufacturing the semiconductor device in the second embodiment.
Figure 4:
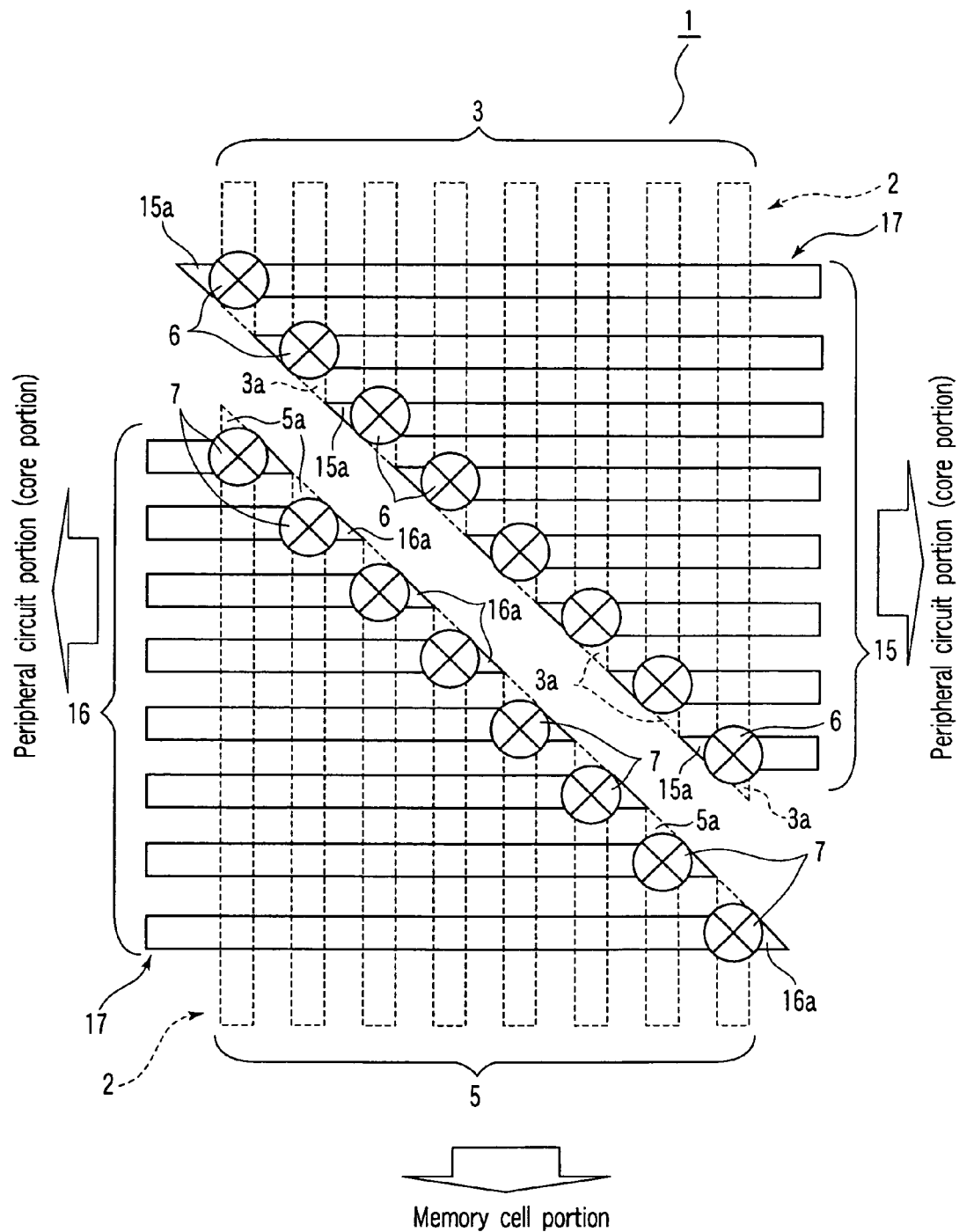
FIG. 4 is a plan view showing a method of manufacturing the semiconductor device in the second embodiment.

Next, a second embodiment of the present invention will be described with reference to FIGS. 2 to 4. FIGS. 2 to 4 are plan views showing a method of manufacturing a semiconductor device in the present embodiment. It is to be noted that the same part as that of the first embodiment is denoted with the same reference numerals, and detailed description thereof is omitted.

In the present embodiment, there will be briefly described a method of forming a wiring pattern 2 of an integrated circuit provided in a semiconductor device 1 of the first embodiment.

FIGS. 2 and 3 show a transfer pattern 11 for use in a lithography process according to the present embodiment. A plurality of line-shaped dummy wiring patterns 12 composed of sacrifice films as second films are formed as shown in FIG. 2 in order to form the wiring pattern 2 of the integrated circuit provided in the semiconductor device 1 of the first embodiment by a so-called side-wall leaving process. Specifically, the respective dummy wiring patterns 12 are formed so that terminal end portions 12a are linearly arranged along a direction obliquely crossing a longitudinal direction of each dummy wiring pattern 12. Side-wall leaving patterns 13 are formed as side-wall films to cover the dummy wiring patterns from side portions around the respective dummy wiring patterns 12. Each side-wall leaving pattern 13 is formed into a so-called closed loop pattern.

Each resist film (resist pattern) 14 for use in the lithography process is formed into a shape shown in FIG. 3 in order to cut the respective side-wall leaving patterns 13 formed into these closed loop patterns, and form a so-called opened pattern. These respective resist patterns 14 are first wiring forming resist films to form first wirings 3 described later. Specifically, the respective resist patterns 14 are provided so that boundary portions between areas of the respective side-wall leaving patterns 13 covered with the respective resist patterns 14 and areas of the respective side-wall leaving patterns 13 exposed from the respective resist patterns 14 are linearly arranged along a direction obliquely crossing the longitudinal direction of each side-wall leaving pattern 13 in the vicinity of each terminal end portion 13a which is one end portion of each side-wall leaving pattern 13.

In this case, the respective resist patterns 14 are provided so that the boundary portions between the areas of the respective side-wall leaving patterns 13 covered with the respective resist patterns 14 and the areas of the respective side-wall leaving patterns 13 exposed from the respective resist patterns 14 are linearly positioned on each terminal end portion 12a which is one end portion of each dummy wiring pattern 12. That is, the respective resist patterns 14 are provided to cover the respective dummy wiring patterns 12 and the respective side-wall leaving patterns 13 so that the terminal end portions 12a of the respective dummy wiring patterns 12 and the terminal end portions 13a of the respective side-wall leaving patterns 13 are exposed. Alternatively, the respective resist patterns 14 are provided such that space patterns between the respective resist patterns 14 are positioned on the terminal end portions 12a of the respective dummy wiring patterns 12 and the terminal end portions 13a of the respective side-wall leaving patterns 13, and obliquely cross the longitudinal directions of the respective dummy wiring patterns 12 and the respective side-wall leaving patterns 13.

Thereafter, there are formed each first wiring 3 and each second wiring 5 composed of the wiring pattern 2 shown in FIG. 1 referred to in the first embodiment through a predetermined lithography process or the like. Subsequently, each third wiring 15 and each fourth wiring 16 composed of wiring patterns 17 shown in FIG. 4 are formed on an upper layer of the respective first and second wirings 3 and 5 through a process similar to the process of forming the respective first and second wirings 3 and 5. Accordingly, a semiconductor device 1 is obtained which is provided with the wiring patterns 2, 17 of the integrated circuit shown in FIG. 4.

It is to be noted that FIG. 4 shows not only the respective first and second wirings 3 and 5 but also the respective third and fourth wirings 15 and 16 as upper-layer wirings (upper-layer wiring patterns) which are not shown in FIG. 1. Each third wiring 15 is provided in a direction intersecting with a longitudinal direction of each first wiring 3. To be more specific, each third wiring 15 is extended long along a direction crossing the longitudinal direction of each first wiring 3 at right angles. Each third wiring 15 is electrically connected to a terminal end portion 15a of each first wiring 3 via each first contact plug 6 in the terminal end portion 15a which is one end portion of each third wiring. Similarly, each fourth wiring 16 is also extended long along the direction crossing the longitudinal direction of each second wiring 5 at right angles. Each fourth wiring 16 is also electrically connected to the terminal end portion 5a of each second wiring 5 via each second contact plug 7 in a terminal end portion 16a which is one end portion of the fourth wiring. Furthermore, the respective third and fourth wirings 15 and 16 are extended long toward directions opposite to each other by 180° via the respective first and second contact plugs 6 and 7. Moreover, the respective third and fourth wirings 15 and 16 compose the wiring patterns 17 of the upper layer of the wiring pattern 2 of the integrated circuit.

As described above, according to the second embodiment, effects similar to those of the first embodiment can be obtained. In the present embodiment, the terminal end portions 12a of the respective dummy wiring patterns 12 are arranged obliquely with respect to the actual wiring patterns 2, 17 composed of the respective first and second wirings 3 and 5. Moreover, to form each side-wall leaving pattern 13 formed as a closed loop pattern into a cut and opened pattern, a part of an edge portion of each resist pattern 14 is formed into an oblique pattern described above with reference to FIG. 3. Accordingly, an alignment margin can be enlarged in aligning each side-wall leaving pattern 13 with each resist pattern 14 as a side-wall film cut pattern. That is, it is possible to efficiently and easily manufacture an LSI (semiconductor device) having large alignment margins between the respective wirings of the upper and lower layers and the contact plugs, and a small area penalty. In addition, it is possible to enhance process latitude (a process margin) in the whole manufacturing process in manufacturing the semiconductor device 1 provided with the wiring patterns 2, 17 of the integrated circuit shown in FIG. 4.

Moreover, as shown in FIG. 4, since the respective first and second wirings 3 and 5 are molded altogether by use of a pair of resist patterns 14 having oblique space patterns, respectively, it is easy to form the wirings, and there is hardly a possibility that the number of steps increases. This also applies to the third and fourth wirings 15 and 16 as described above.

As described above, according to the method of manufacturing the semiconductor device of the second embodiment, it is possible to efficiently and easily manufacture the semiconductor device in which the wiring pattern is improved and in which drawing properties of the wirings are enhanced regardless of a size of the wiring to be formed or a pitch between the wirings. Moreover, a possibility that an electric problem such as short-circuit between the wirings occurs is suppressed, and an area in which the wirings are formed is space-saved. That is, according to the method of manufacturing the semiconductor device of the present embodiment, it is possible to efficiently and easily manufacture the semiconductor device 1 which can sufficiently cope with further miniaturization, high integration, and compactification. Specifically, according to the method of manufacturing the semiconductor device of the present embodiment, it is possible to efficiently and easily manufacture an LSI adaptable to the further miniaturization, high integration, and compactification as the semiconductor device 1 having the above-described wiring patterns 2, 17.

It is to be noted that the method of manufacturing the semiconductor device 1 described in the present embodiment will be described in more detail later in a fourth embodiment.

Third Embodiment

Figure 5:
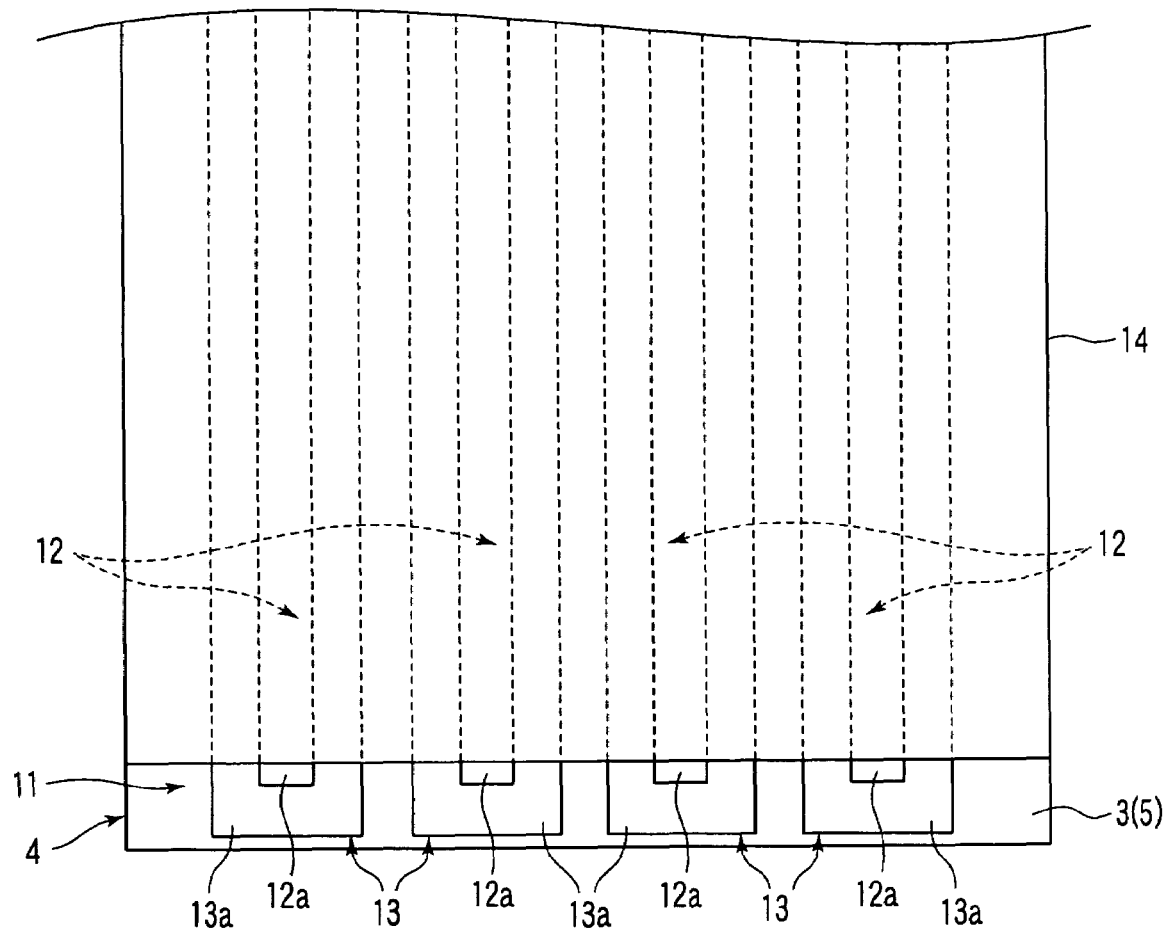
FIG. 5 is a plan view showing a first comparative example with respect to a third embodiment.

Next, a third embodiment of the present invention will be described with reference to FIGS. 5 to 11. FIGS. 5 to 6 are plan views showing a first comparative example with respect to the present embodiment. FIG. 7 is a plan view showing a second comparative example of the present embodiment. FIGS. 8 to 11 are plan views showing a method of manufacturing a semiconductor device in the present embodiment. It is to be noted that the same parts as those of the first and second embodiments are denoted with the same reference numerals, and detailed description thereof is omitted.

In the present embodiment, there will be described a method of forming wiring patterns 2, 17 of an integrated circuit provided in a semiconductor device 1 described above in the first and second embodiments.

First, a method of manufacturing a semiconductor device according to the first and second comparative examples will be described with reference to FIGS. 5 to 7 prior to description of the present embodiment.

As described in the second embodiment, to form the wiring pattern 2 shown in, for example, FIG. 4, first, after forming each side-wall leaving pattern 13 around each dummy wiring pattern 12, each dummy wiring pattern 12 is peeled from a semiconductor substrate 4 to leave the only each side-wall leaving pattern 13 on the semiconductor substrate 4. However, since each side-wall leaving pattern 13 is formed as a closed loop pattern as described above, for example, at least one place of a terminal end portion 13a of each side-wall leaving pattern 13 has to be cut in order to form each side-wall leaving pattern 13 into an opened pattern.

In this case, it is assumed that, as shown in, for example, FIG. 5, each resist pattern 14 is provided such that each dummy wiring pattern 12 and each side-wall leaving pattern 13 cross along a direction crossing a longitudinal direction of each pattern at right angles in the vicinity of a terminal end portion 12a of each dummy wiring pattern 12 and the terminal end portion 13a of each side-wall leaving pattern 13. Moreover, the terminal end portions 12a, 13a of each dummy wiring pattern 12 and each side-wall leaving pattern 13 as bases of circuit patterns are cut vertically to a longitudinal direction of each pattern. In this case, as shown in FIG. 6, each first wiring 3 (each third wiring 5) formed in a predetermined interlayer insulating film 23 on the semiconductor substrate 4 based on such side-wall leaving pattern 13 has a substantially equal length in the longitudinal direction. Moreover, each terminal end portion 3a (5a) has a pattern formed in a position linearly crossing each first wiring 3 (each third wiring 5) along a direction crossing the longitudinal direction of each wiring at right angles.

It is assumed that each first contact plug 6 (second contact plug 7) is provided on each terminal end portion 3a (5a) of each first wiring 3 (each third wiring 5) composed of such pattern. In this case, as described in the related art, in a case where misalignment is caused between each first wiring 3 (each third wiring 5) and each first contact plug 6 (each second contact plug 7), there is a high danger that the respective adjacent first wirings 3 (the respective third wirings 5) mutually short-circuit via each first contact plug 6 (each second contact plug 7).

Moreover, to avoid such danger, a technology has already been considered in which the respective first contact plugs 6 (the respective second contact plugs 7) are linearly arranged along a direction obliquely crossing the longitudinal direction of each first wiring 3 (each third wiring 5), and provided on the respective first wirings 3 (the respective third wirings 5) as shown in FIG. 7. This can enlarge a misalignment margin between each first wiring 3 (each third wiring 5) and each first contact plug 6 (each second contact plug 7). Additionally, in the wiring pattern shown in FIG. 7, as described in the related art, a tip portion of each first wiring 3 (each third wiring 5) from each first contact plug 6 (each second contact plug 7) becomes an unnecessary portion for a circuit in each first wiring 3 (each third wiring 5) whose start end portion 3b (5b) as the other end portion or whose intermediate portion is provided with the first contact plug 6 (second contact plug 7) excluding the first wiring 3 (third wiring 5) whose terminal end portion 3a (5a) is provided with the first contact plug 6 (second contact plug 7) among the respective first wirings 3 (the respective third wirings 5). Additionally, a whole tip area of each first wiring 3 (each third wiring 5) from each first contact plug 6 (each second contact plug 7) becomes a useless (unnecessary) area in an area (wiring forming area) of the substrate 4 on which each first wiring 3 (each third wiring 5) is provided excluding an area in which the first wiring 3 (third wiring 5) provided with the first contact plug 6 (second contact plug 7) in its terminal end portion 3a (5a) is formed.

Specifically, an area surrounded with a broken line of FIG. 7 becomes a dead space (area penalty) of the substrate 4. Therefore, when the number of wirings increases in the above-described wiring pattern, the dead space (area penalty) on the substrate 4 increases. That is, in the wiring pattern in which the respective first contact plugs 6 (the respective second contact plugs 7) are arranged along the direction obliquely crossing the longitudinal direction of each first wiring 3 (each third wiring 5), there is a remarkably high possibility that further miniaturization, high integration, and compactification of the semiconductor device are hindered.

The present embodiment has been developed to collectively avoid the problems of the related art. There will be described hereinafter a method (method of manufacturing a semiconductor device) of forming the wiring pattern of the integrated circuit of the present embodiment. Specifically, there will be described a method (method of manufacturing the semiconductor device) of forming the wiring pattern of the integrated circuit capable of realizing both of enhancement of a misalignment margin between each first wiring 3 (each third wiring 5) and each first contact plug 6 (each second contact plug 7) and reduction of the area penalty on the substrate 4.

Figure 8:
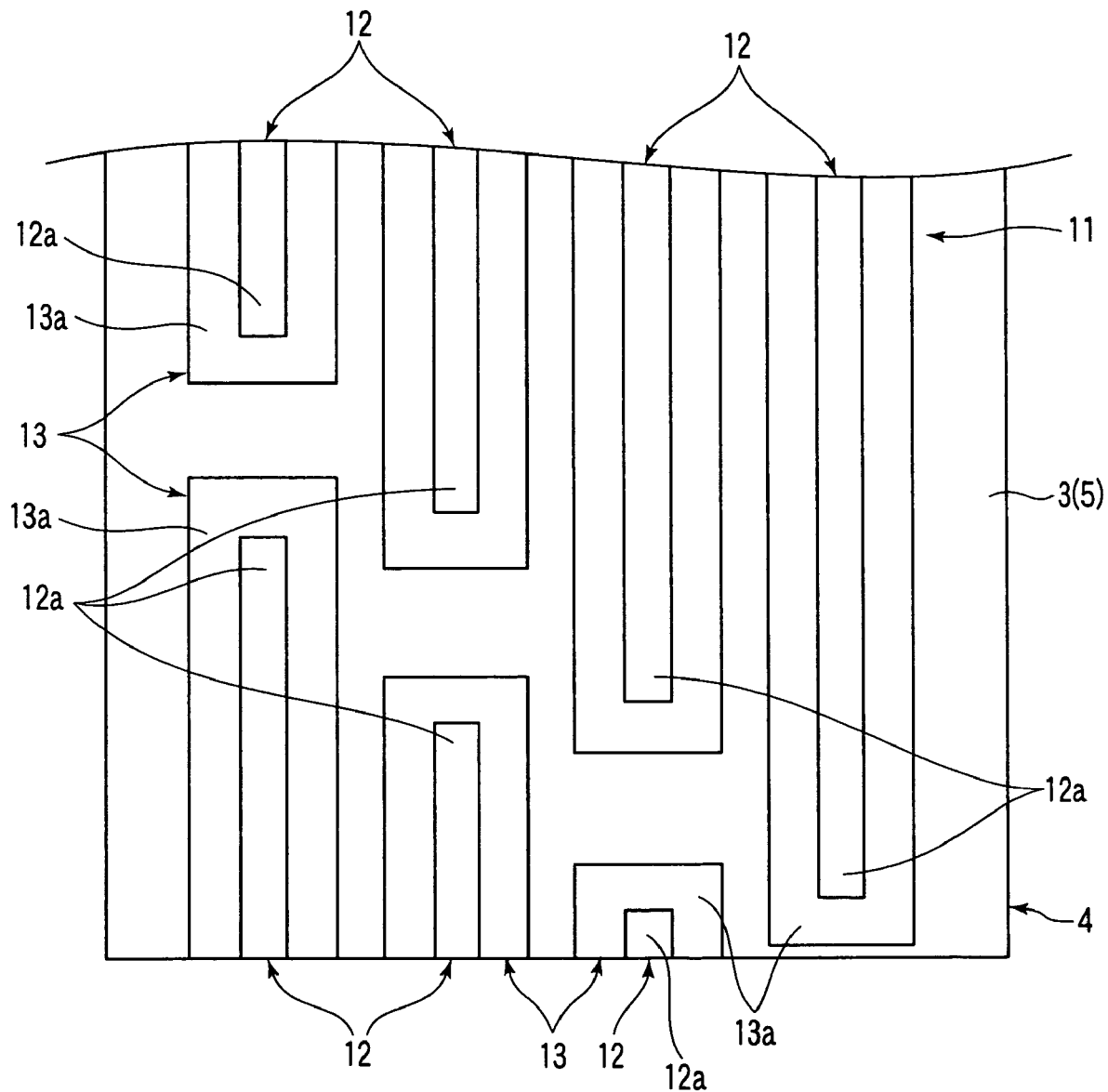
FIG. 8 is a plan view showing a method of manufacturing the semiconductor device in the third embodiment.

First, as shown in FIG. 8, each dummy wiring pattern 12 and each side-wall leaving pattern 13 are formed so that the respective terminal end portions 12a, 13a are linearly arranged along directions obliquely crossing the longitudinal directions of each dummy wiring pattern 12 and each side-wall leaving pattern 13 in the same manner as in the second embodiment. Moreover, each dummy wiring pattern 12 and each side-wall leaving pattern 13 are extended long toward directions opposite to each other by 180° via the respective terminal end portions 12a, 13a.

Figure 9:
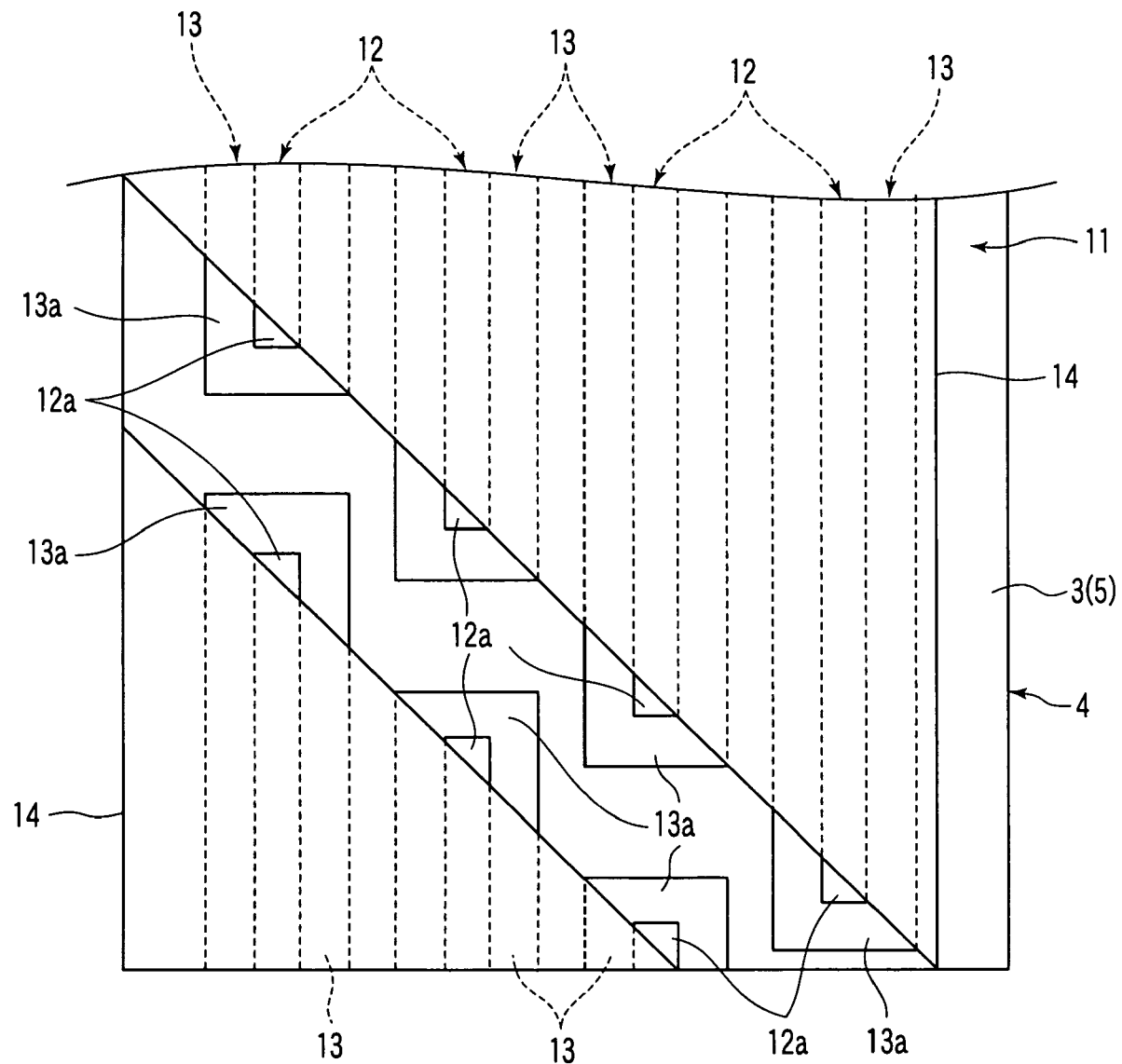
FIG. 9 is a plan view showing a method of manufacturing the semiconductor device in the third embodiment.

Next, as shown in FIG. 9, each resist pattern 14 is provided by a usual lithography process so that boundary portions between areas of the respective side-wall leaving patterns 13 covered with the respective resist patterns 14 and areas of the respective side-wall leaving patterns 13 exposed from the respective resist patterns 14 are linearly arranged along the direction obliquely crossing the longitudinal direction of each side-wall leaving pattern 13 in the vicinity of the terminal end portion 13a which is one end portion of each side-wall leaving pattern 13 in the same manner as in the second embodiment. In this case, each resist pattern 14 is provided so that the boundary portion between the area of each side-wall leaving pattern 13 covered with each resist pattern 14 and the area of each side-wall leaving pattern 13 exposed from each resist pattern 14 is positioned on the terminal end portion 12a which is one end portion of each dummy wiring pattern 12. That is, each resist pattern 14 is provided by covering each dummy wiring pattern 12 and each side-wall leaving pattern 13 so that the terminal end portion 12a of each dummy wiring pattern 12 and the terminal end portion 13a of each side-wall leaving pattern 13 are exposed. Alternatively, each resist pattern 14 is provided such that space patterns between the respective resist patterns 14 are positioned on the terminal end portions 12a of the respective dummy wiring patterns 12 and the terminal end portions 13a of the respective side-wall leaving patterns 13, and obliquely cross the longitudinal directions of each dummy wiring pattern 12 and each side-wall leaving pattern 13.

Figure 10:
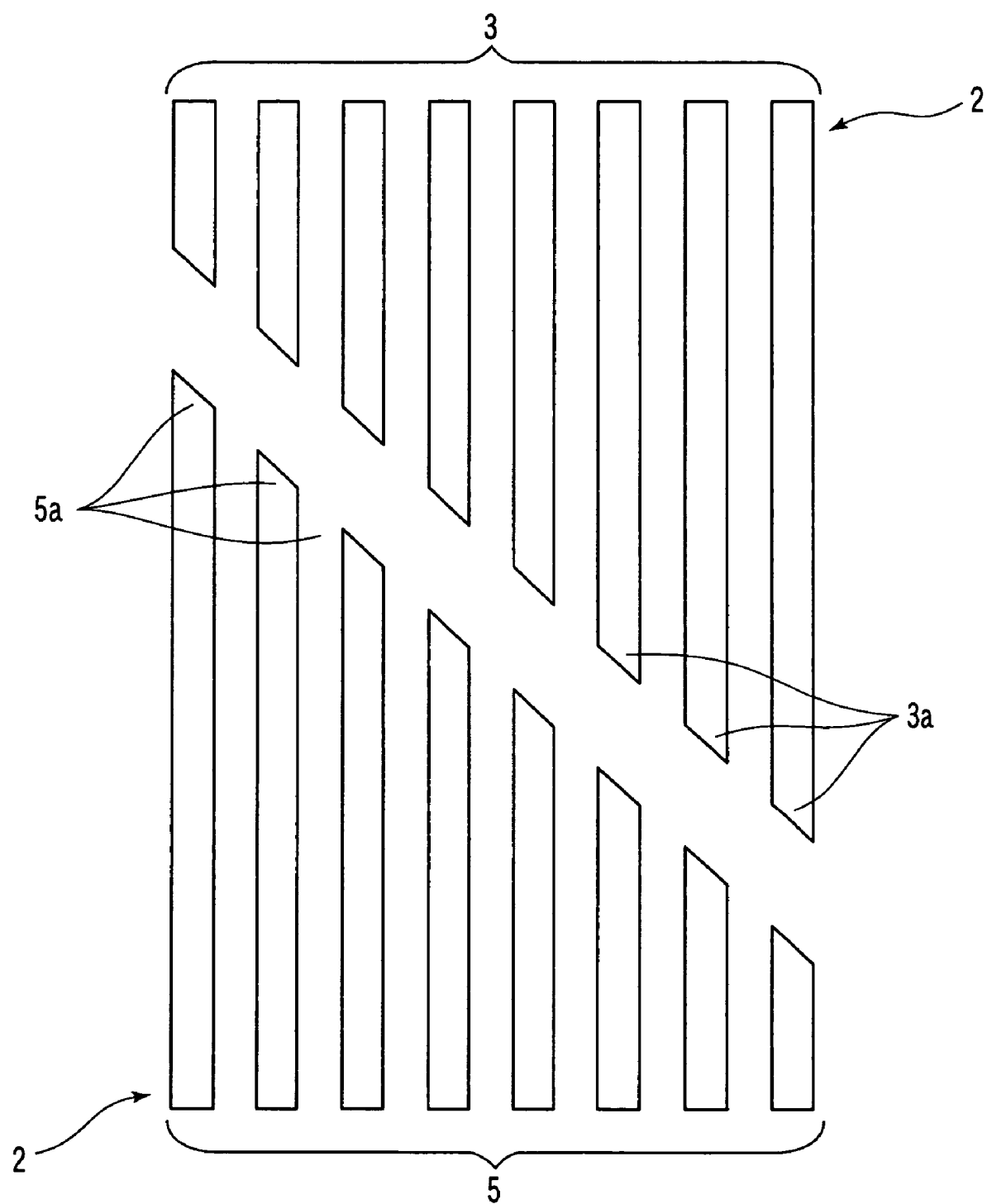
FIG. 10 is a plan view showing a method of manufacturing the semiconductor device in the third embodiment.

Thereafter, portions of each dummy wiring pattern 12 and each side-wall leaving pattern 13 exposed from each resist pattern 14 are removed by etching. Accordingly, each side-wall leaving pattern 13 composed of substantially the same pattern as that of each first wiring 3 (each third wiring 5) which is an actual wiring pattern is formed beside each dummy wiring pattern 12. Subsequently, after peeling each dummy wiring pattern 12 left on the substrate 4 from the substrate 4, a predetermined film to be worked which is a substrate film is etched using each side-wall leaving pattern 13 as a mask. Consequently, as shown in FIG. 10, the respective first wirings 3 and the respective third wirings 5 composed of wiring patterns similar to those of the first and second embodiments can be provided on the substrate 4. That is, the substrate 4 can be provided with the respective first wirings 3 and the respective third wirings 5 formed such that they are extended long toward directions opposite to each other by 180° via the respective terminal end portions 3a, 5a and that the respective terminal end portions 3a, 5a are provided facing each other via predetermined intervals and linearly arranged along the direction obliquely crossing the longitudinal direction.

Figure 11:
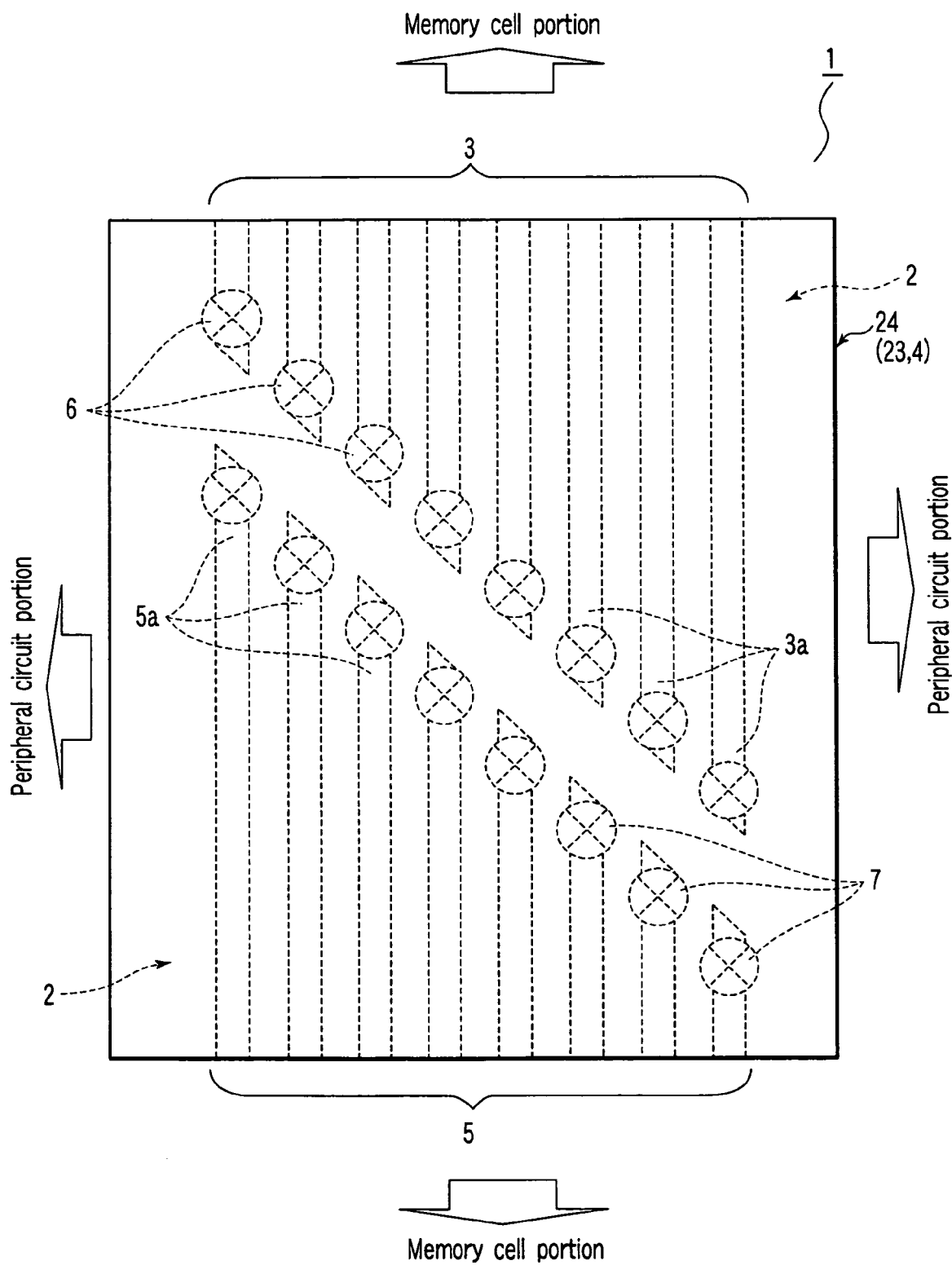
FIG. 11 is a plan view showing a method of manufacturing the semiconductor device in the third embodiment.

Next, as shown in FIG. 11, an interlayer insulating film 24 for forming upper-layer wirings is provided on the substrate 4 to cover the respective first wirings 3 and the respective third wirings 5. Subsequently, each first contact plug 6 and each second contact plug 7 are provided on the respective terminal end portions 3a, 5a of the respective first and third wirings 3 and 5, respectively. Subsequently, although not shown, the respective third and fourth wirings are provided as upper-layer wiring patterns having the wiring patterns described in the second embodiment on an upper layer of the layer provided with the respective first and third wirings 3 and 5. Accordingly, as shown in FIG. 11, the wiring pattern 2 drawn from a memory cell portion (not shown) is formed. That is, there is obtained the semiconductor device 1 provided with a desired wiring pattern shown in FIG. 11.

As described above, according to the third embodiment, effects similar to those of the first and second embodiments can be obtained. Moreover, as shown in FIG. 11, according to the present embodiment, a tip portion area of each first wiring 3 from the terminal end portion 3a (each first contact plug 6) can be provided with each second wiring 5 facing each first wiring 3 unlike the wiring pattern of the related art shown in FIG. 7. That is, the tip portion area of each first wiring 3 from the terminal end portion 3a can be effectively utilized as an area for forming another wiring, circuit or the like. In the present embodiment, a plurality of second wirings 5 are provided in the tip portion area of each first wiring 3 from the terminal end portion 3a, but these second wirings 5 do not have to be necessarily provided. In a case where another wiring such as the second wiring, circuit or the like is not formed in the tip portion area of the first wiring 3 from the terminal end portion 3a, the area may be reduced or omitted beforehand in a design stage. Consequently, useless spaces on the substrate 4 and in the semiconductor device 1 can be saved. In consequence, according to the present embodiment, unlike the related art, it is possible to achieve further miniaturization, high integration, and compactification of the semiconductor device 1. It is to be noted that the method of manufacturing the semiconductor device 1 described in the present embodiment will be described in more detail in the next fourth embodiment in the same manner as in the second embodiment:

Fourth Embodiment

Next, a fourth embodiment of the present invention will be described with reference to FIGS. 12A to 22B. FIGS. 12A to 22B are plan views or step sectional views showing a method of a semiconductor device in the present embodiment. It is to be noted that the same parts as those of the first to third embodiments are denoted with the same reference numerals, and detailed description thereof is omitted.

In the present embodiment, there will be described in detail the method of manufacturing the semiconductor device in the first embodiment briefly described above in the second and third embodiments. Specifically, there will be described in detail a method of forming a wiring pattern of an integrated circuit provided in a semiconductor device 1. In the present embodiment, a hard mask is combined with a slimming step in a so-called side-wall leaving process to thereby form a desired wiring pattern. It is to be noted that in the description of the present embodiment, it is assumed that each first wiring 3 and each third wiring 15 are formed among the first to fourth wirings 3, 5, 15, and 16. The respective second and fourth wirings 5 and 16 are substantially the same as the respective first and third wirings 3 and 15 except that symmetric wiring patterns are formed about terminal end portions 3a, 5a, 15a, and 16a as symmetry centers of the first to fourth wirings 3, 5, 15, and 16. Therefore, the description of a method of forming the first and third wirings is omitted.

Figure 12A:
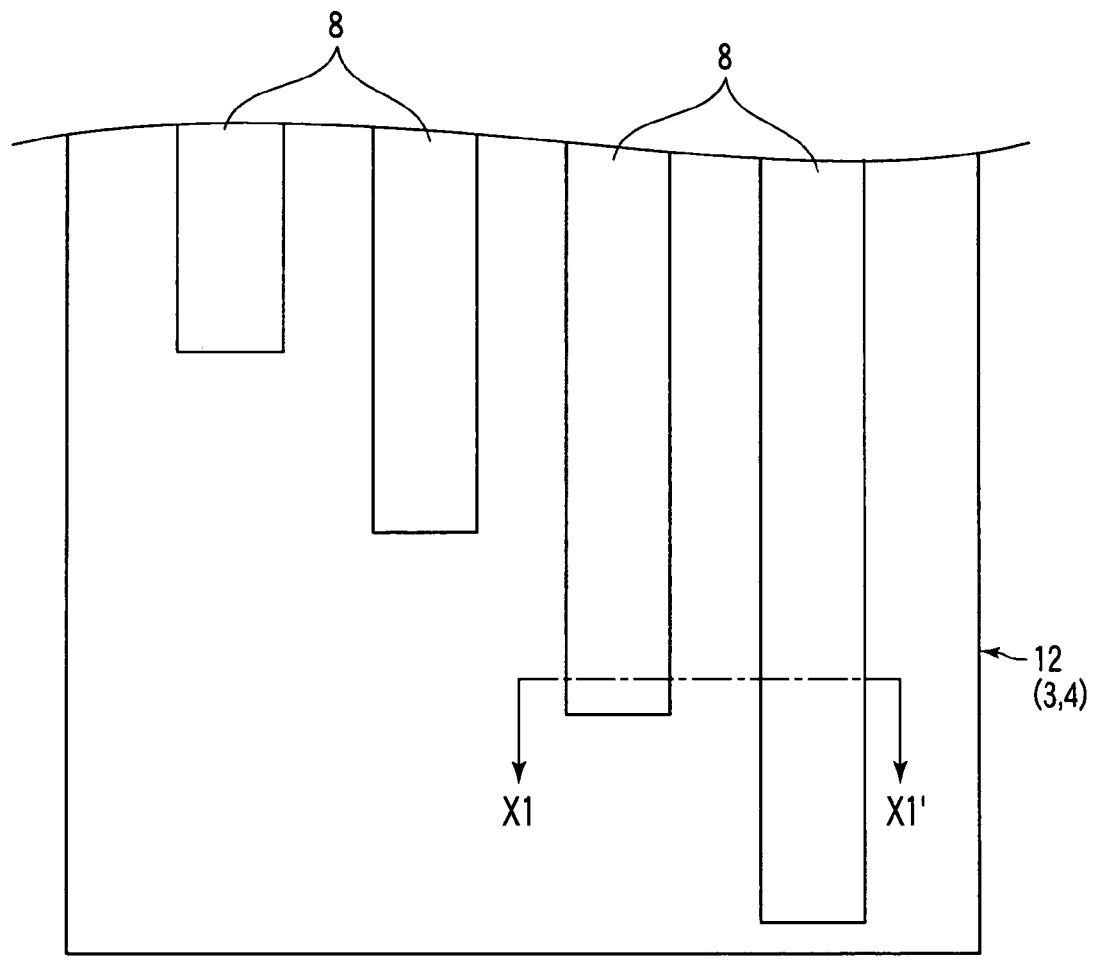
FIG. 12A is a plan view showing a method of manufacturing a semiconductor device in a fourth embodiment.
Figure 12B:
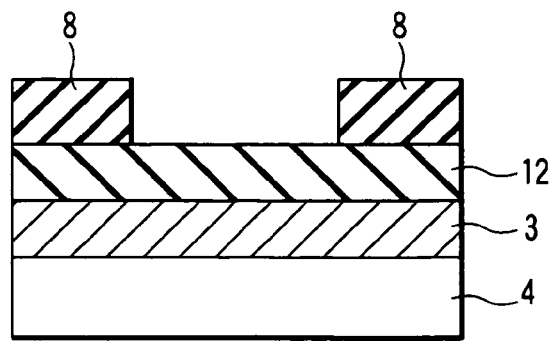
FIG. 12B is a sectional view taken along broken line X1-X1' in FIG. 12A.
Figure 13A:
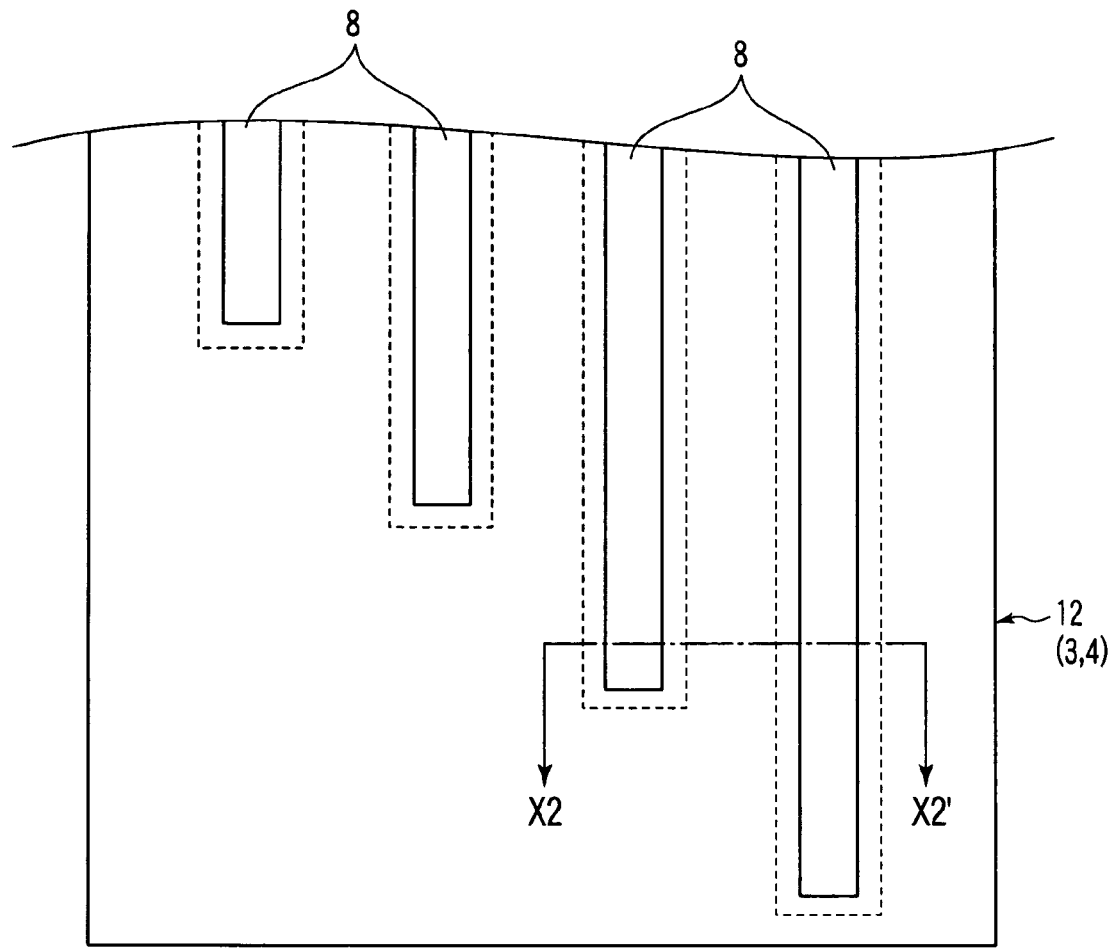
FIG. 13A is a plan view showing a method of manufacturing the semiconductor device in the fourth embodiment.
Figure 13B:
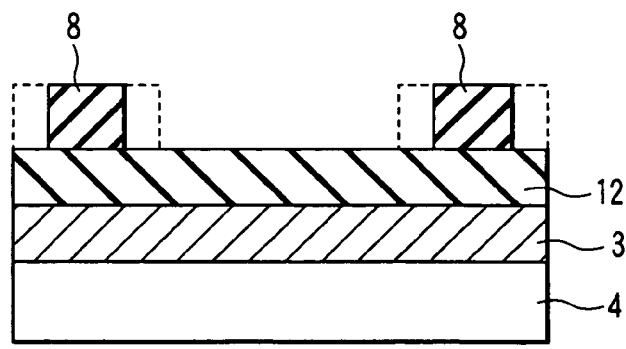
FIG. 13B is a sectional view taken along broken line X2-X2' in FIG. 13A.
Figure 14A:
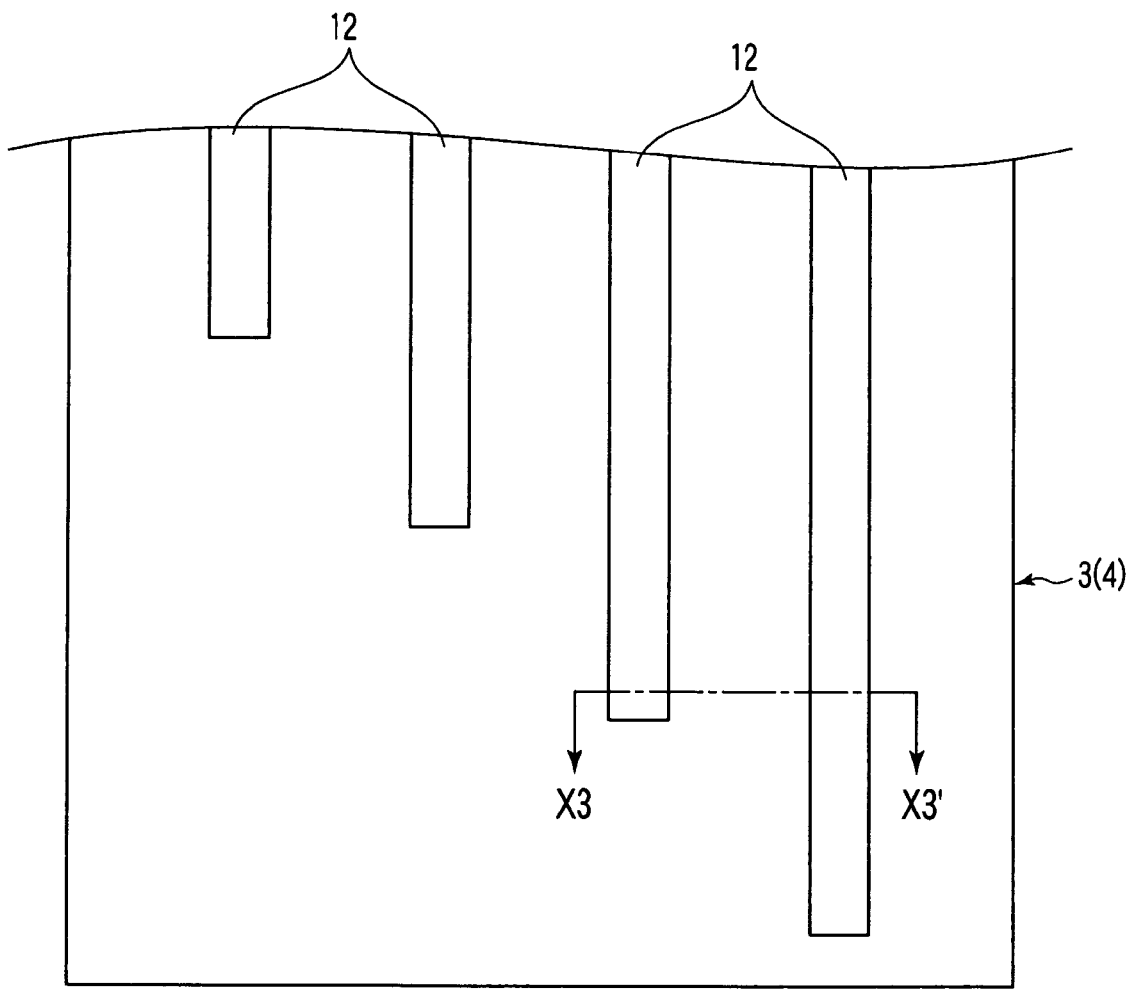
FIG. 14A is a plan view showing a method of manufacturing the semiconductor device in the fourth embodiment.
Figure 14B:
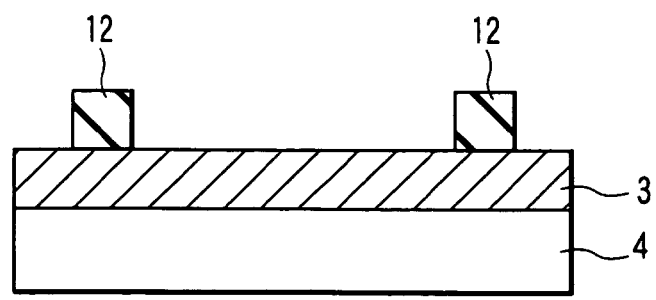
FIG. 14B is a sectional view taken along broken line X3-X3' in FIG. 14A.

First, as shown in FIGS. 12A and 12B, the surface of a conductive layer (conductive material, electrode material) 3 as a first film which is a material of each first wiring provided on a semiconductor substrate 4 is entirely covered, and a sacrifice film 12 is provided as a film to be worked on the surface. In the present embodiment, a hard mask 12 is used as the sacrifice film. This hard mask 12 composes each dummy wiring pattern described above in the second and third embodiments. Subsequently, the surface which covers the hard mask 12 is entirely covered, and a resist film 8 is provided on the surface. Subsequently, this resist film 8 is worked by a lithography process to form resist patterns 8 as so-called line & space pattern. In the present embodiment, the respective resist patterns 8 are formed to extend longer or contract shorter from one side toward the other side along a direction in which they are arranged. It is to be noted that FIG. 12B is a sectional view taken along broken line X1-X1' in FIG. 12A;

Next, as shown in FIGS. 13A and 13B, each resist pattern 8 is reduced by etching. This step is usually referred to as slimming. As a slimming technology, there is, for example, a technology to slim each resist pattern 8 by a chemical dry etching (CDE) method which is one type of isotropic etching. There is also a technology to adjust a slimming amount by setting an etching time to be slightly longer during the etching of a reflection preventive film (not shown) under each resist pattern 8 by a reactive ion etching (RIE) method which is one type of anisotropic etching, thereby forming each resist pattern 8 having a desired size. It is to be noted that FIG. 13B is a sectional view taken along broken line X2-X2' in FIG. 13A;

Next, as shown in FIGS. 14A and 14B, the hard masks 12 are etched using each resist pattern 8 subjected to the slimming step as a mask. In this etching step, the RIE method (anisotropic etching) is generally used. Subsequently, the respective resist patterns 8 are peeled from the hard masks 12. It is to be noted that FIG. 14B is a sectional view taken along broken line X3-X3' in FIG. 14A.

Figure 15A:
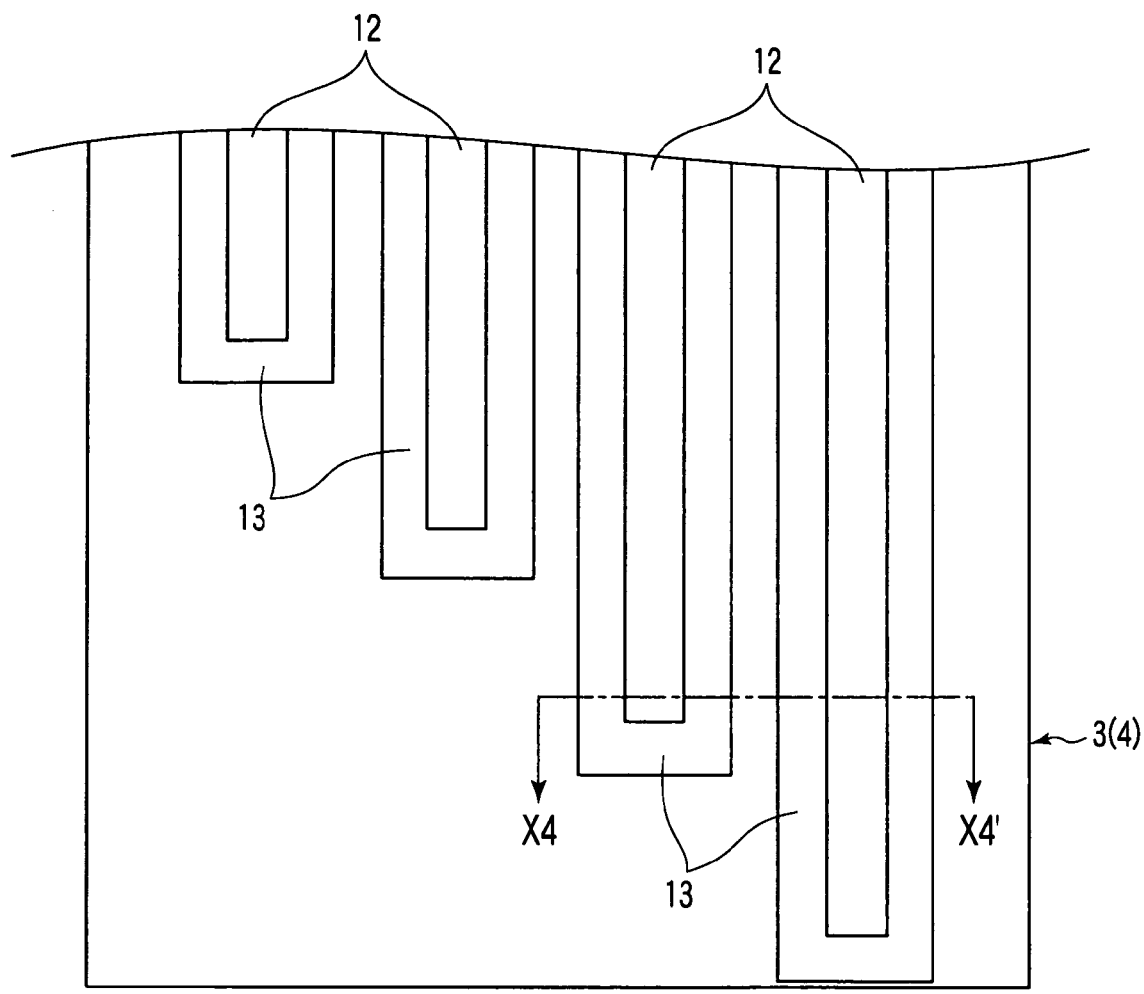
FIG. 15A is a plan view showing a method of manufacturing the semiconductor device in the fourth embodiment.
Figure 15B:
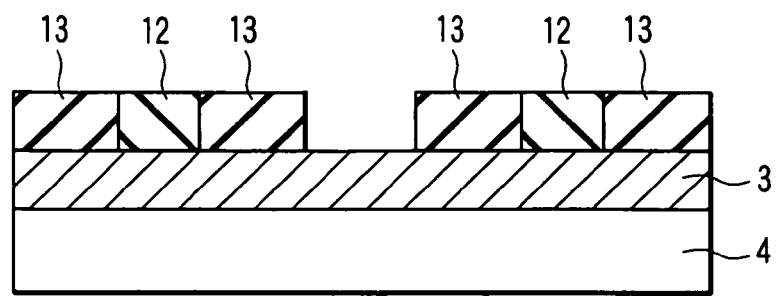
FIG. 15B is a sectional view taken along broken line X4-X4' in FIG. 15A.

Next, as shown in FIGS. 15A and 15B, a side-wall material 13 composing each side-wall leaving pattern described above in the second and third embodiments is deposited on the whole surface of the conductive layer 3 to cover a side portion of each hard mask 12. As a technology to deposit this sidewall material 13, a CVD method, a sputtering method or the like is generally used. Subsequently, the side-wall material 13 deposited on the whole surface of the conductive layer 3 is entirely etching by, for example, the RIE method, and the respective side-wall leaving patterns 13 composed of closed loop patterns are individually formed to cover the side portions of the respective hard masks 12. It is to be noted that FIG. 15B is a sectional view taken along broken line X4-X4' of FIG. 15A.

Figure 16A:
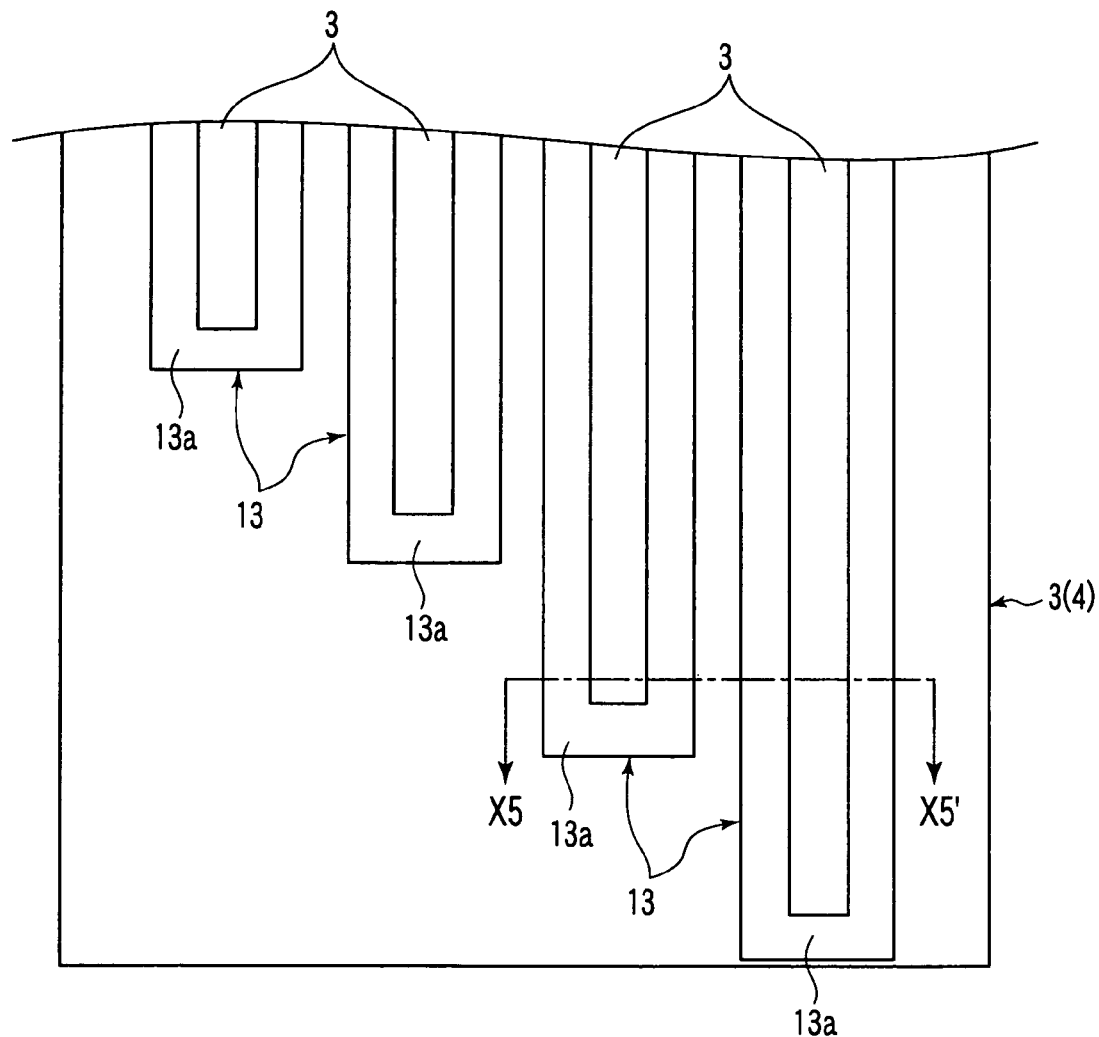
FIG. 16A is a plan view showing a method of manufacturing the semiconductor device in the fourth embodiment.
Figure 16B:
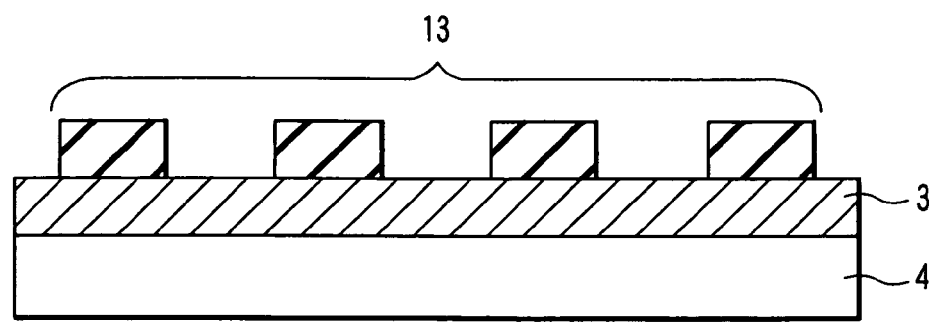
FIG. 16B is a sectional view taken along broken line X5-X5' in FIG. 16A.

Next, as shown in FIGS. 16A and 16B, each hard mask 12 only is peeled and removed from the conductive layer 3 by the isotropic etching. Subsequently, the step shifts to a step of cutting a terminal end portion 13a of each side-wall leaving pattern 13. It is to be noted that FIG. 16B is a sectional view taken along broken line X5-X5' of FIG. 16A.

Figure 17A:
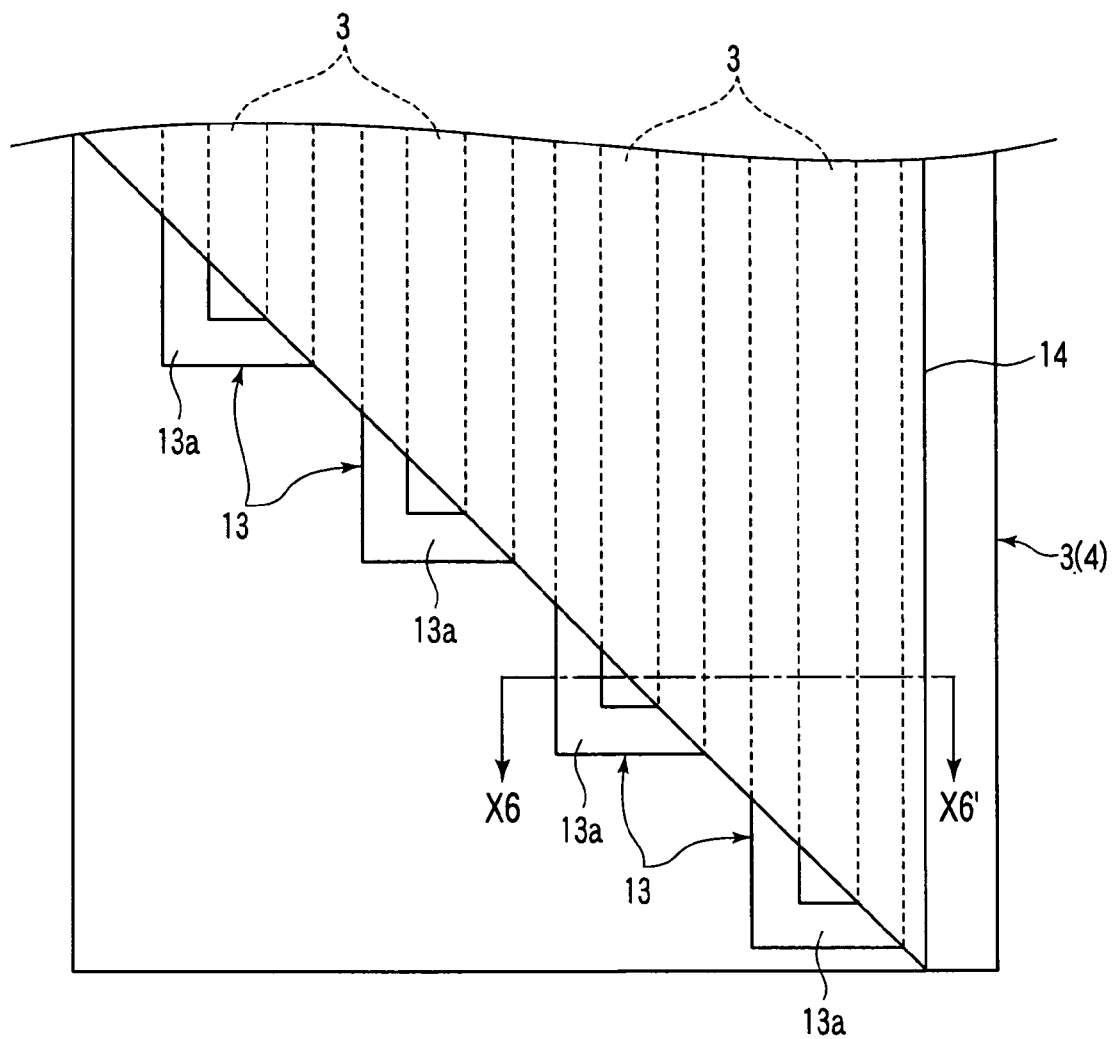
FIG. 17A is a plan view showing a method of manufacturing the semiconductor device in the fourth embodiment.
Figure 17B:
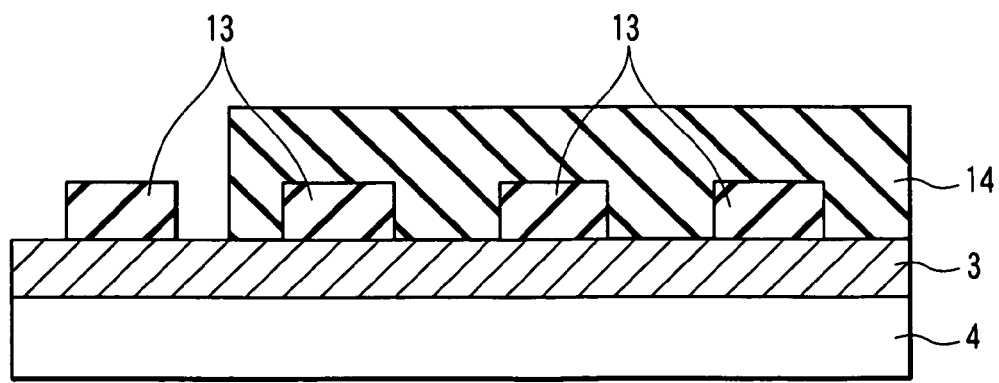
FIG. 17B is a sectional view taken along broken line X6-X6' in FIG. 17A.

Next, as shown in FIGS. 17A and 17B, a resist pattern 14 is provided in such a manner that boundary portions between areas of the respective side-wall leaving patterns 13 covered with the resist pattern 14 and areas of the respective side-wall leaving patterns 13 exposed from the resist pattern 14 are linearly arranged along a direction obliquely crossing a longitudinal direction of each side-wall leaving pattern 13 in the vicinity of the terminal end portion 13a which is one end portion of each side-wall leaving pattern 13. It is to be noted that FIG. 17B is a sectional view taken along broken line X6-X6' of FIG. 17A.

Figure 18A:
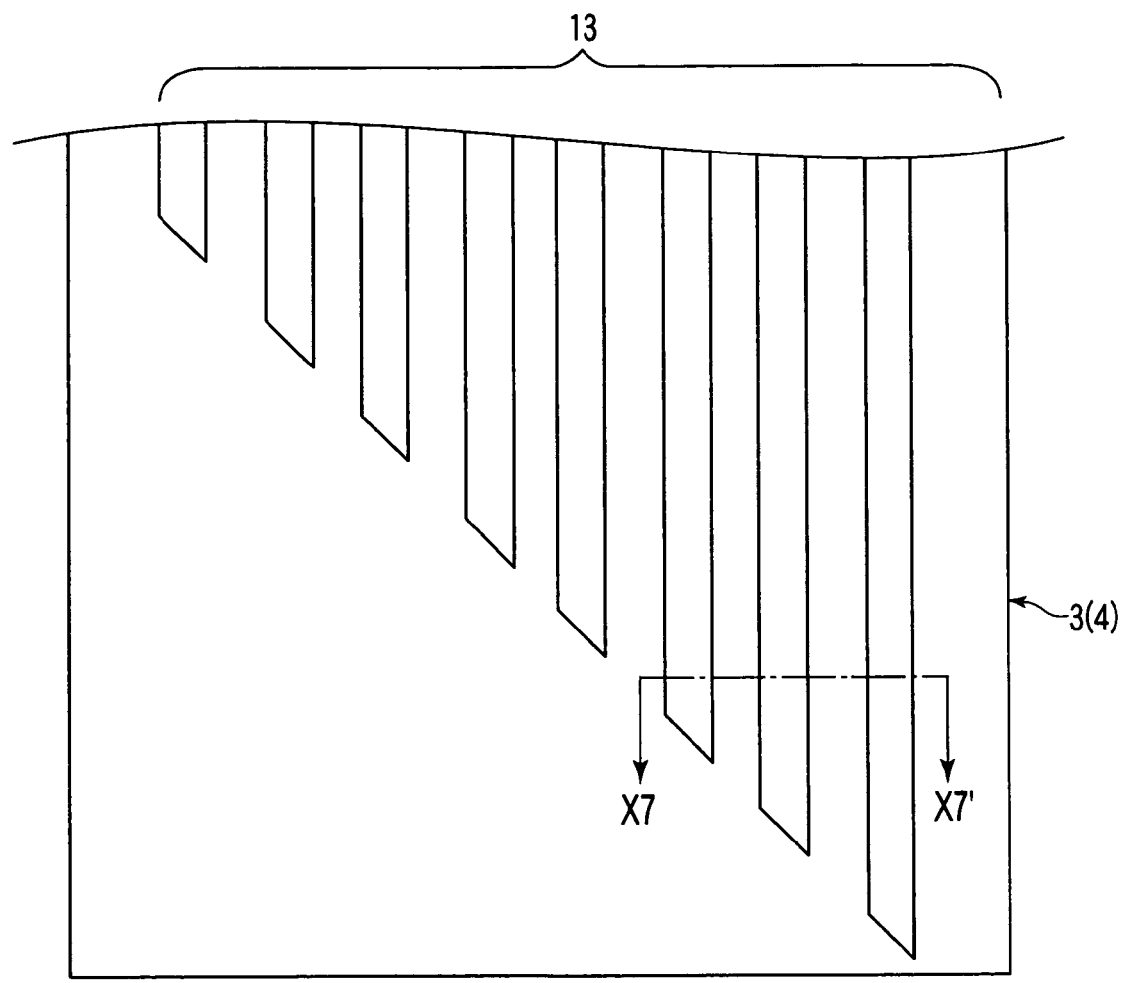
FIG. 18A is a plan view showing a method of manufacturing the semiconductor device in the fourth embodiment.
Figure 18B:
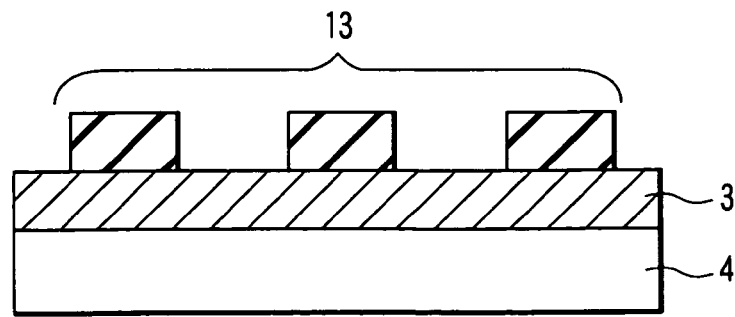
FIG. 18B is a sectional view taken along broken line X7-X7' in FIG. 18A.

Next, as shown in FIGS. 18A and 18B, the terminal end portions 13a of the respective side-wall leaving patterns 13 are removed and cut by the etching by use of the resist pattern 14 formed into the above-described shape as a mask. Thereafter, the resist pattern 14 is peeled and removed from the conductive layer 3. It is to be noted that FIG. 18B is a sectional view taken along broken line X7-X7' of FIG. 18A.

Figure 19A:
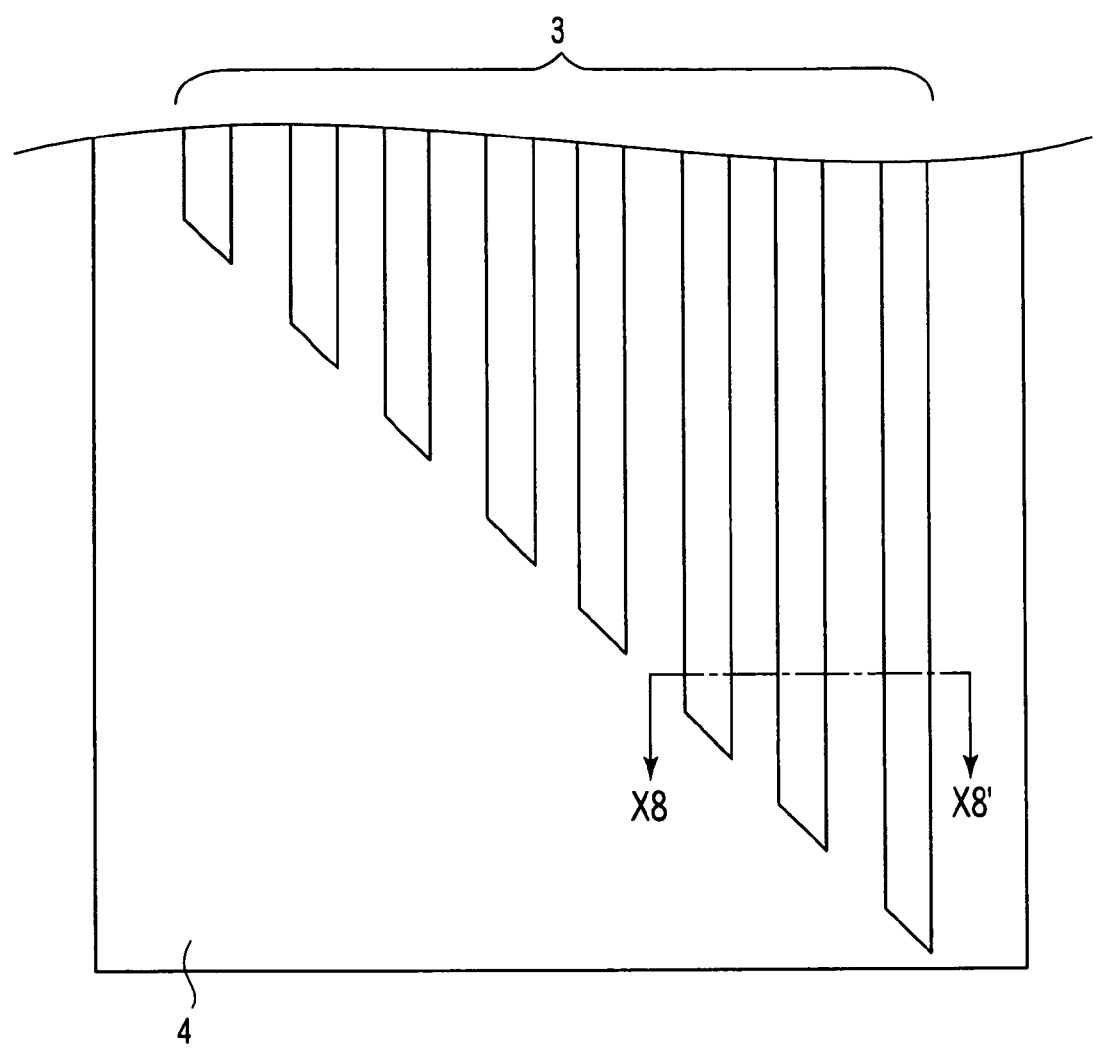
FIG. 19A is a plan view showing a method of manufacturing the semiconductor device in the fourth embodiment.
Figure 19B:
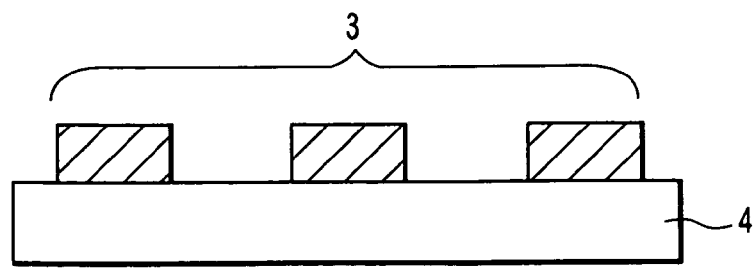
FIG. 19B is a sectional view taken along broken line X8-X8' in FIG. 19A.

Next, as shown in FIGS. 19A and 19B, the conductive layer 3 is etched using, as a mask, each side-wall leaving pattern 13 from which each terminal end portion 3a has been cut. Subsequently, each side-wall leaving pattern 13 is peeled and removed from the conductive layer 3. Accordingly, as shown in FIG. 19A, a plurality of first wirings 3 can be provided in a predetermined layer on the substrate 4. The wirings are formed to extend longer or contract shorter from one side toward the other side along the direction in which they are arranged on the substrate 4, and arranged in positions mutually displaced from one another in a direction crossing, at right angles, the direction in which one end portion 3a of each of the adjacent wirings is provided. It is to be noted that FIG. 19B is a sectional view taken along broken line X8-X8' of FIG. 19A.

Figure 20A:
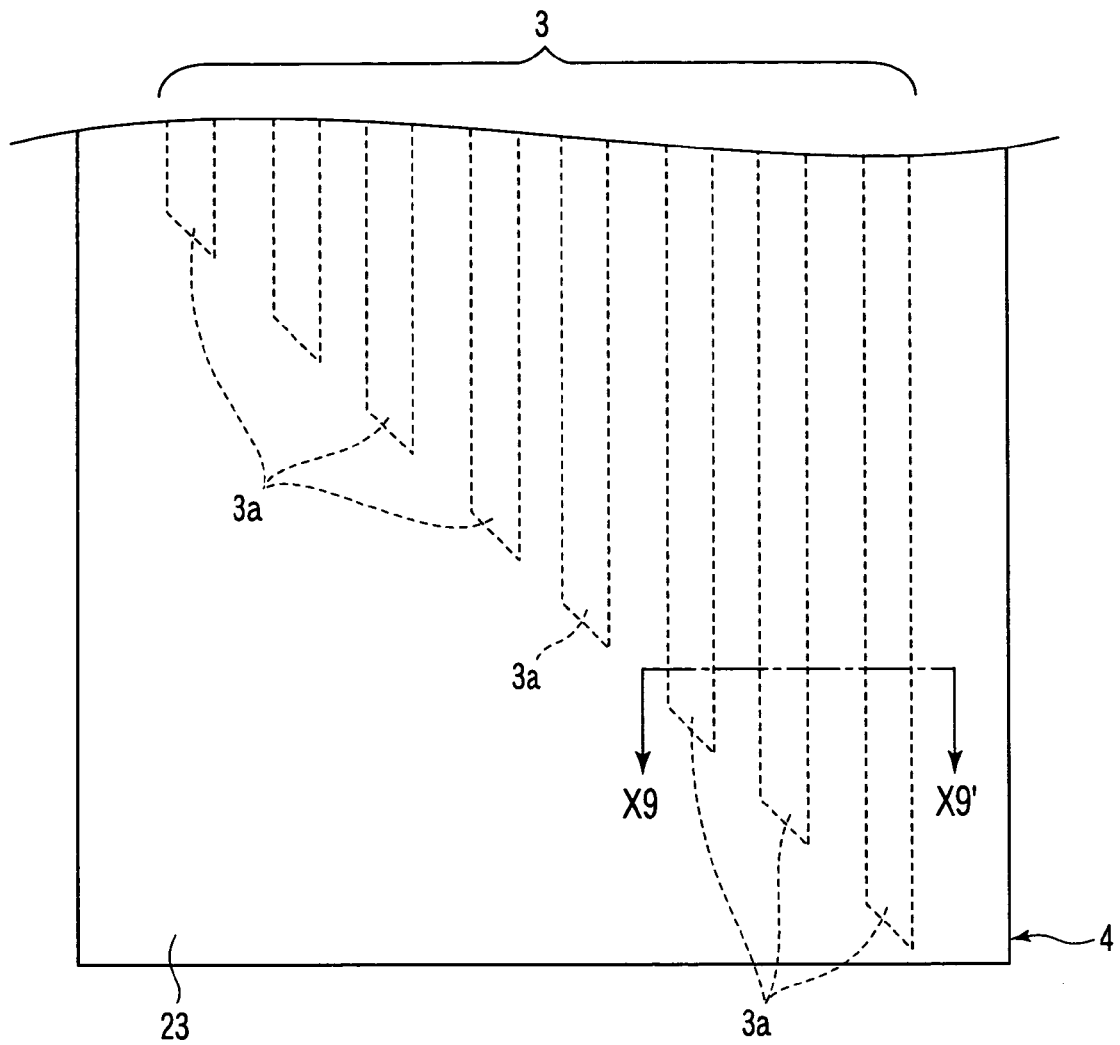
FIG. 20A is a plan view showing a method of manufacturing the semiconductor device in the fourth embodiment.
Figure 20B:
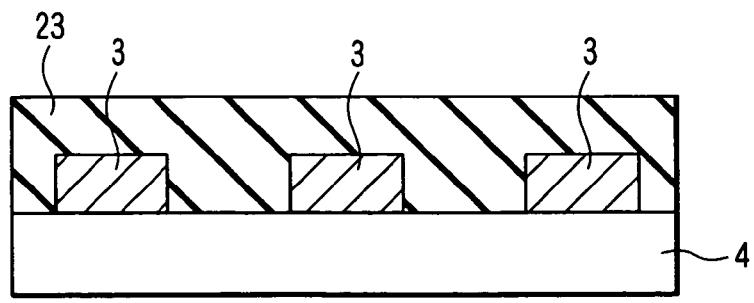
FIG. 20B is a sectional view taken along broken line X9-X9' in FIG. 20A.

Next, as shown in FIGS. 20A and 20B, an interlayer insulating film 23 is deposited on the whole surface of the substrate 4 to cover each first wiring 3 formed into a desired shape. It is to be noted that FIG. 20B is a sectional view taken along broken line X9-X9' of FIG. 20A.

Figure 21A:
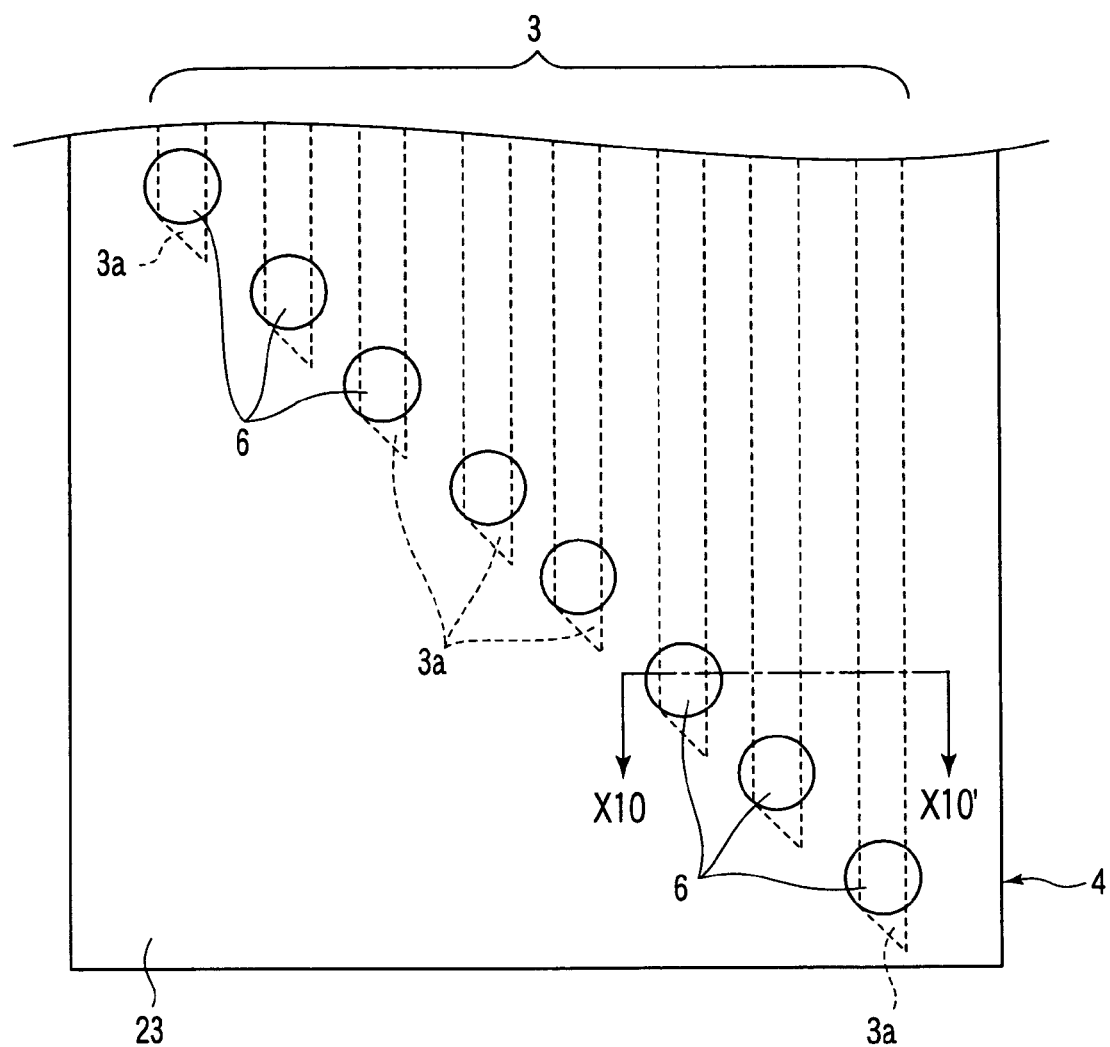
FIG. 21A is a plan view showing a method of manufacturing the semiconductor device in the fourth embodiment.
Figure 21B:
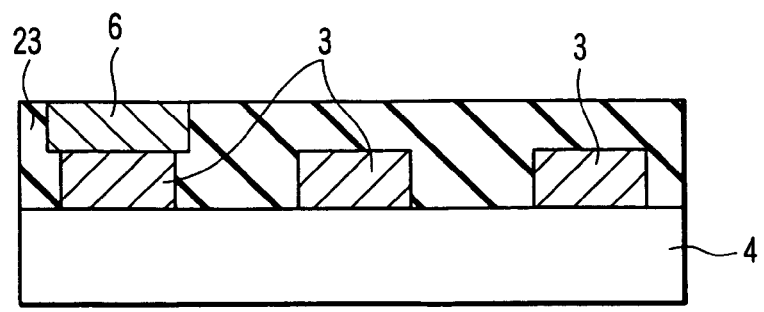
FIG. 21B is a sectional view taken along broken line X10-X10' in FIG. 21A.

Next, as shown in FIGS. 21A and 21B, each first contact plug 6 is buried in the interlayer insulating film 23 on the terminal end portion 3a of each first wiring 3. It is to be noted that FIG. 21B is a sectional view taken along broken line X10-X10' of FIG. 21A.

Figure 22A:
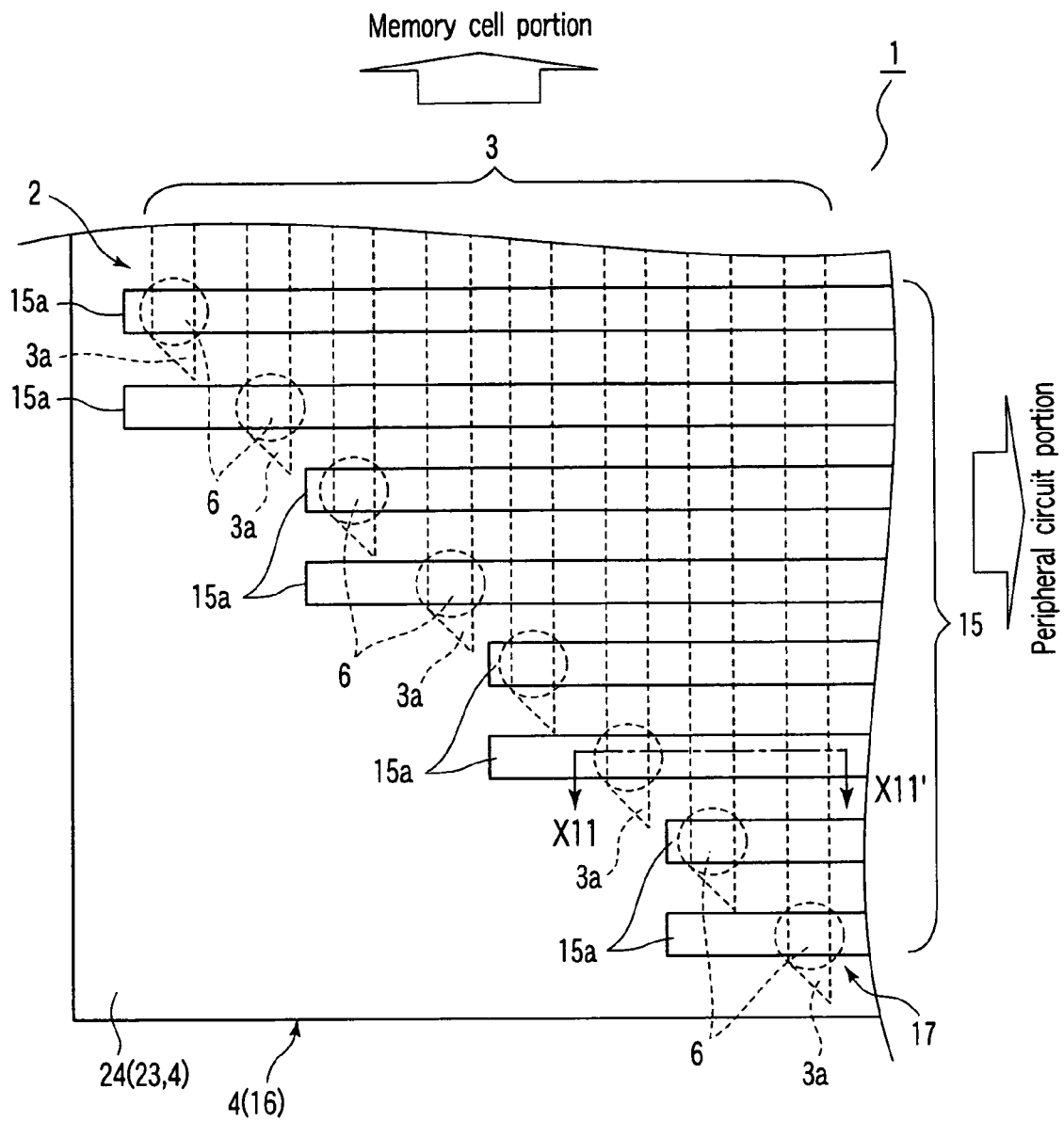
FIG. 22A is a plan view showing a method of manufacturing the semiconductor device in the fourth embodiment.
Figure 22B:
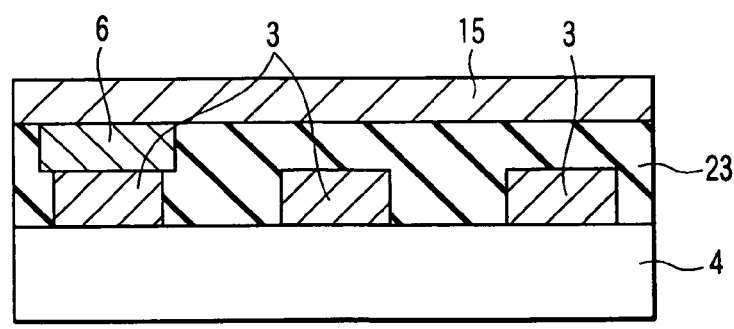
FIG. 22B is a sectional view taken along broken line X11-X11' in FIG. 22A.

Next, as shown in FIGS. 22A and 22B, an interlayer insulating film 24 of an upper layer is provided on the surface of the interlayer insulating film 23 to cover each first wiring 3 and each first contact plug 6. Moreover, a plurality of third wirings 15 as upper-layer wirings are provided on the interlayer insulating film 24 of the upper layer, and extended long in a direction crossing the longitudinal direction of each first wiring 3 at right angles from above the terminal end portion 3a of each first wiring 3. A terminal end portion 15a of each third wiring 15 is formed in a position electrically connected to the terminal end portion 3a of each lower-layer wiring pattern 3 via each first contact plug 6. Accordingly, a semiconductor device 1 provided with a desired wiring pattern is obtained. That is, as shown in FIG. 22A, it is possible to form the wiring pattern of the integrated circuit composed of desired patterns including lead wiring patterns 2, 17 from a memory cell portion to a peripheral circuit portion (not shown). It is to be noted that FIG. 22B is a sectional view taken along broken line X11-X11' in FIG. 22A.

As described above, according to this fourth embodiment, effects similar to those of the first to third embodiments can be obtained. In a case where a design rule of each third wiring 15 as the upper-layer wiring has latitude as compared with that of each first wiring 3 as the lower-layer wiring, unlike the wiring pattern described above in the second embodiment with reference to FIG. 4, the position of the terminal end portion 15a of each third wiring 15 may be a position shown in FIG. 22A. That is, the terminal end portions 15a of one set of adjacent third wirings 15 may be provided in mutually overlapping positions in the direction crossing the longitudinal direction of each third wiring 15 at right angles.

Fifth Embodiment

Next, a fifth embodiment of the present invention will be described with reference to FIGS. 23A to 26. FIGS. 23A to 26 are plan views or step sectional views showing a method of manufacturing a semiconductor device in the present embodiment. It is to be noted that the same parts as those of the first to fourth embodiments are denoted with the same reference numerals, and detailed description thereof is omitted.

In the present embodiment, there will be described a method of forming each third wiring 15 among third and fourth wirings 15 and 16 as the above-described upper-layer wirings. Since each fourth wiring 16 is substantially the same as each third wiring 15 except that each fourth wiring is formed as a wiring pattern symmetric to each third wiring 15 by use of terminal end portions 15a, 16a of the respective third and fourth wirings 15, 16, the description of a method of forming the fourth wiring is omitted.

Figure 23A:
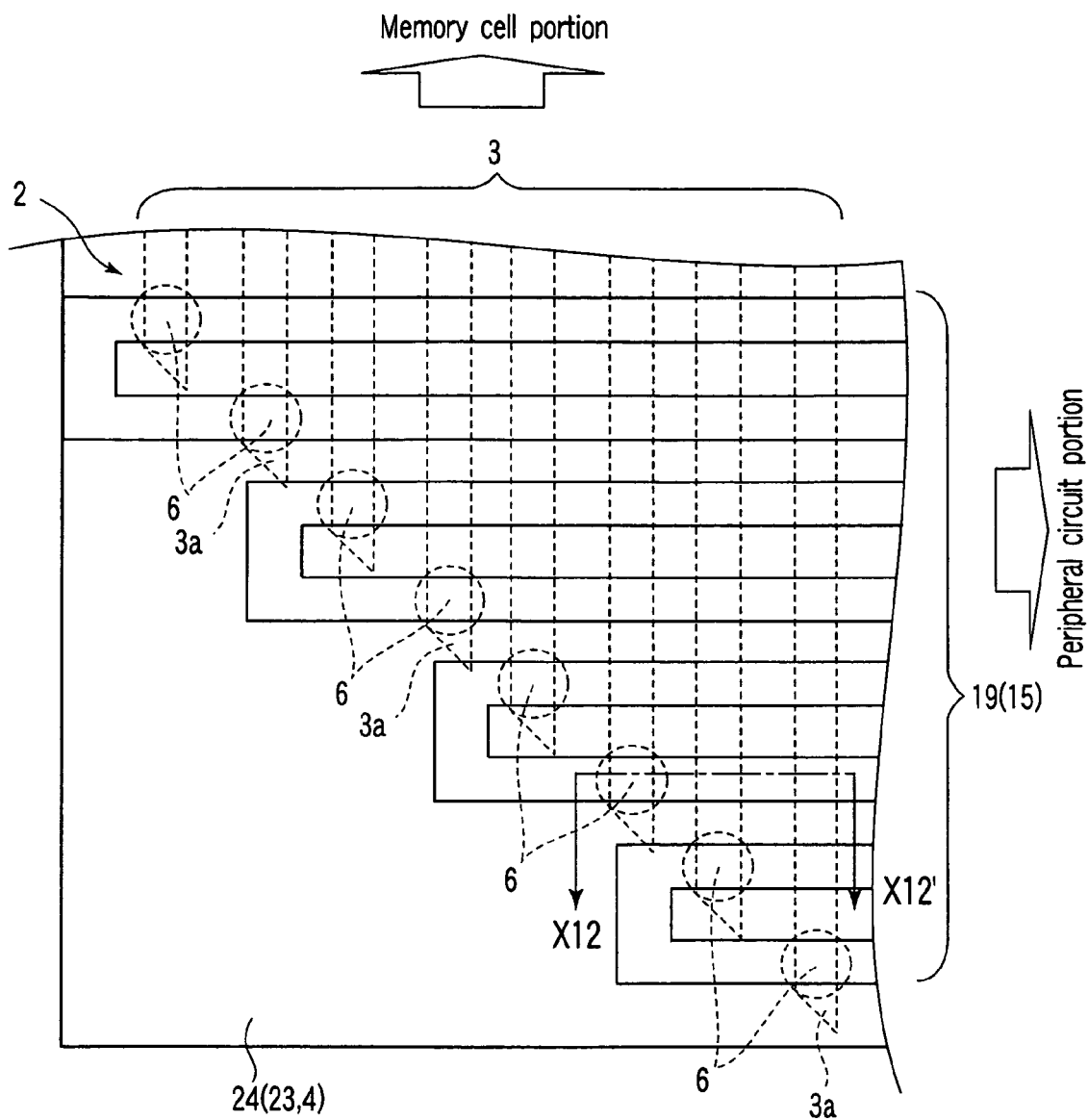
FIG. 23A is a plan view showing a method of manufacturing a semiconductor device in a fifth embodiment.
Figure 23B:
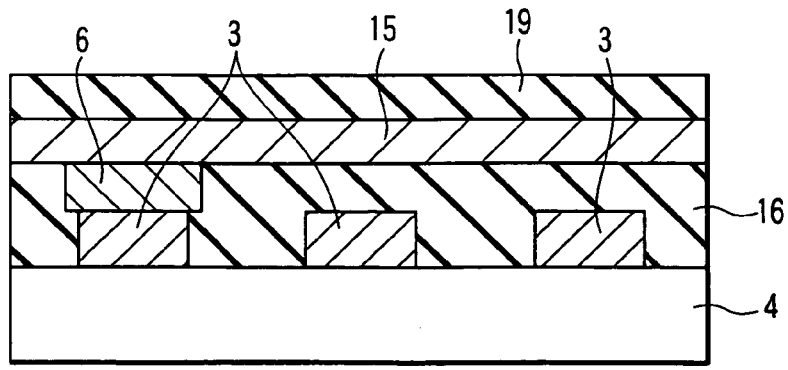
FIG. 23B is a sectional view taken along broken line X12-X12' in FIG. 23A.

First, as shown in FIGS. 23A and 23B, after providing each first contact plug 6 on the terminal end portion 3a of each first wiring 3, a conductive layer (conductive material, electrode material) 15 composing a material of each third wiring is provided substantially along a wiring pattern of each third wiring 15 in an interlayer insulating film 24 of an upper layer of an interlayer insulating film 23 provided with each first wiring 3 and each first contact plug 6. Subsequently, each side-wall leaving pattern 19 composed of a closed loop pattern is formed substantially on the conductive layer 15 composing each third wiring by the above-described side-wall leaving process. It is to be noted that FIG. 23B is a sectional view taken along broken line X12-X12' in FIG. 23A.

Figure 24A:
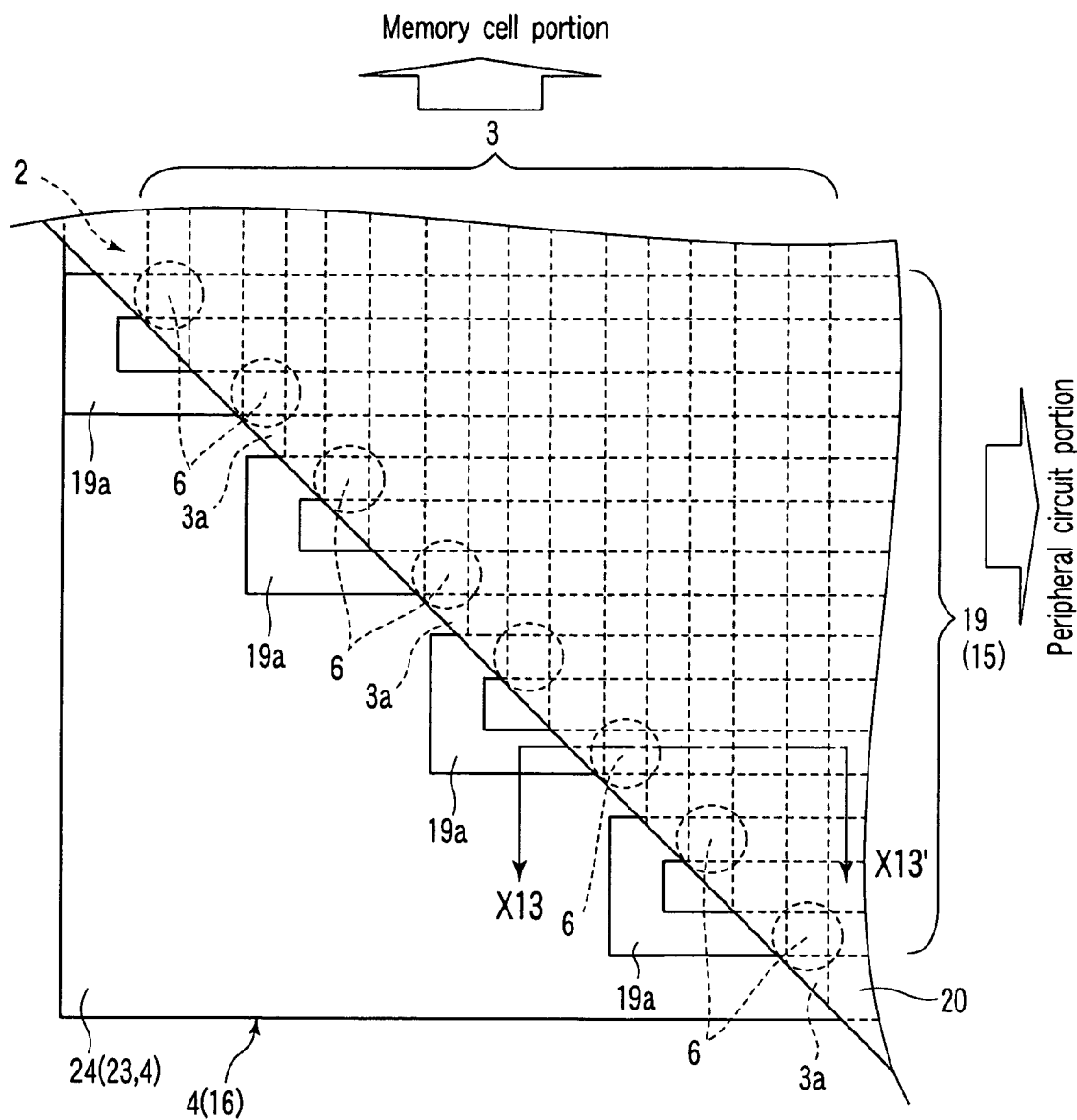
FIG. 24A is a plan view showing a method of manufacturing a semiconductor device in the fifth embodiment.
Figure 24B:
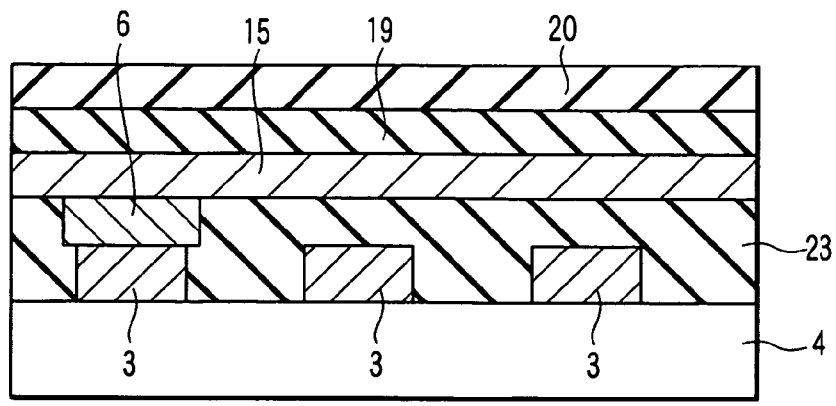
FIG. 24B is a sectional view taken along broken line X13-X13' in FIG. 24A.

Next, as shown in FIGS. 24A and 24B, a resist film (resist pattern) 20 for forming upper-layer wirings is provided to expose a terminal end portion 19a of each side-wall leaving pattern 19 and cover each side-wall leaving pattern 19. Also in the present embodiment, since each side-wall leaving pattern 19 is formed as a closed loop pattern in the same manner as in each side-wall leaving pattern 13 of the lower layer, the terminal end portion 19a of each side-wall leaving pattern 19 needs to be cut in the same manner as in forming each first wiring 3. Therefore, as shown in FIG. 24A, the resist pattern 20 is formed into a shape similar to that of the above-described resist pattern 14. That is, the resist pattern 20 is formed in such a manner that boundary portions between areas of the respective side-wall leaving patterns 19 covered with the resist pattern 20 and areas of the respective side-wall leaving patterns 19 exposed from the resist pattern 20 are linearly arranged along the direction obliquely crossing the longitudinal direction of each side-wall leaving pattern 19 in the vicinity of the terminal end portion 19a which is one end portion of each side-wall leaving pattern 19. It is to be noted that FIG. 24B is a sectional view taken along broken line X13-X13' in FIG. 24A.

Figure 25A:
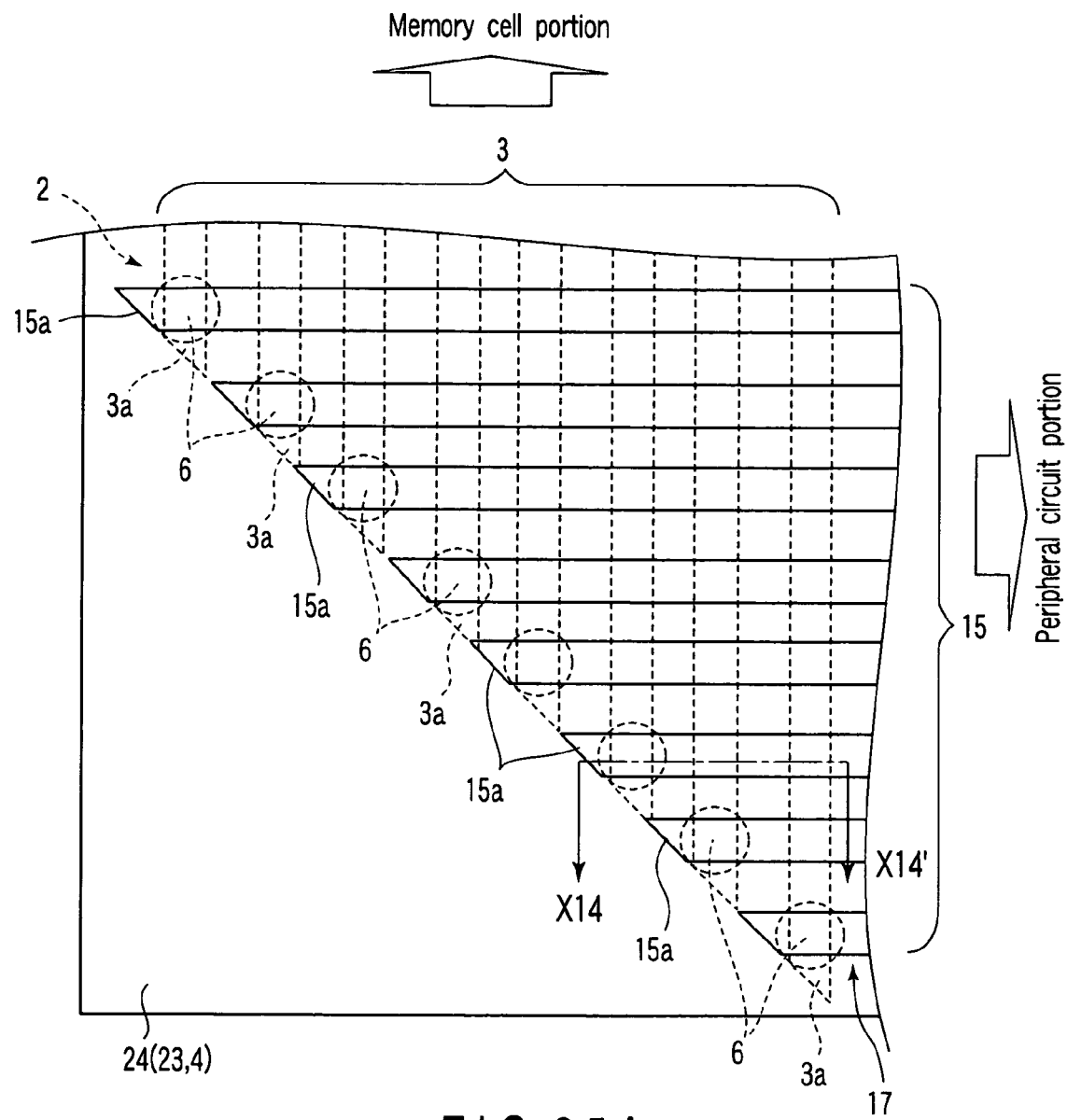
FIG. 25A is a plan view showing a method of manufacturing a semiconductor device in the fifth embodiment.
Figure 25B:
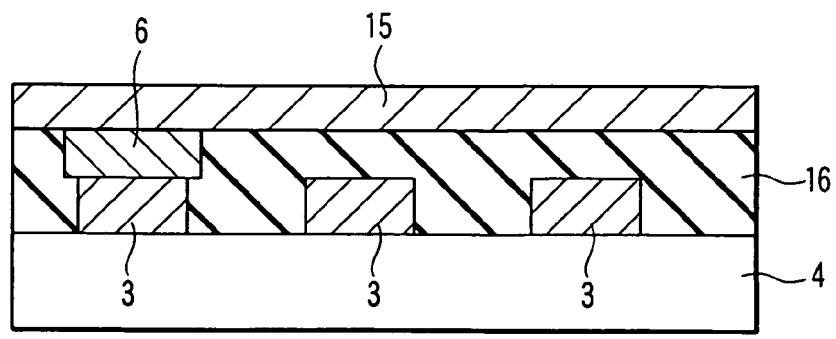
FIG. 25B is a sectional view taken along broken line X14-X14' in FIG. 25A.

Next, as shown in FIGS. 25A and 25B, the terminal end portion 19a of each side-wall leaving pattern 19 is removed and cut by etching by use of the resist pattern 20 as a mask.

Subsequently, the resist pattern 20 provided on the interlayer insulating film 24 to cover each side-wall leaving pattern 19 is peeled and removed. Thereafter, the conductive layer 15 is etched using as a mask each side-wall leaving pattern 19 from which each terminal end portion 19a has been cut. Subsequently, each side-wall leaving pattern 19 is peeled and removed from the conductive layer 15. Accordingly, as shown in FIG. 25A, a plurality of third wirings 15 can be provided on an upper layer of the layer provided with each first wiring 3. The wirings are formed to extend longer or contract shorter from one side toward the other side along the direction in which the lines are arranged on the substrate 4, and provided in positions displaced from one another in a direction crossing at right angles a direction in which one end portion 3a of each of the adjacent wirings is provided. As shown in FIG. 25A, each first wiring 3 is formed to extend long along the direction crossing the longitudinal direction of each first wiring 3 at right angles. It is to be noted that FIG. 25B is a sectional view taken along broken line X14-X14' in FIG. 25A.

Figure 26:
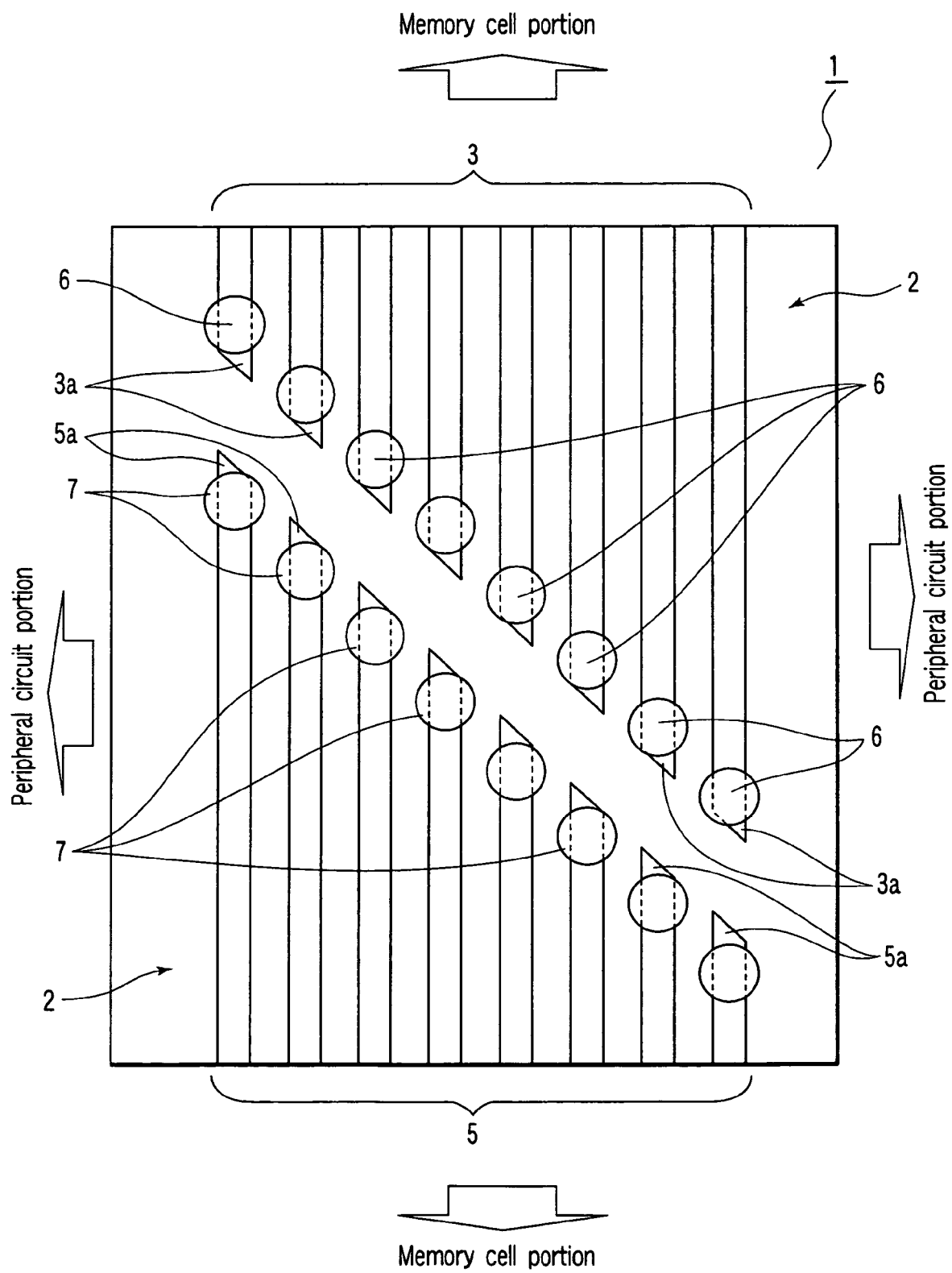
FIG. 26 is a plan view showing a method of manufacturing the semiconductor device in the fifth embodiment.

As described above, according to this fifth embodiment, effects similar to those of the first to fourth embodiments can be obtained. When predetermined steps are performed after ending the step shown in FIGS. 25A and 25B, it is possible to obtain the semiconductor device 1 provided with the wiring pattern 2 or the like of the integrated circuit as shown in FIG. 26 in the same manner as in the first embodiment.

Sixth Embodiment

Figure 27:
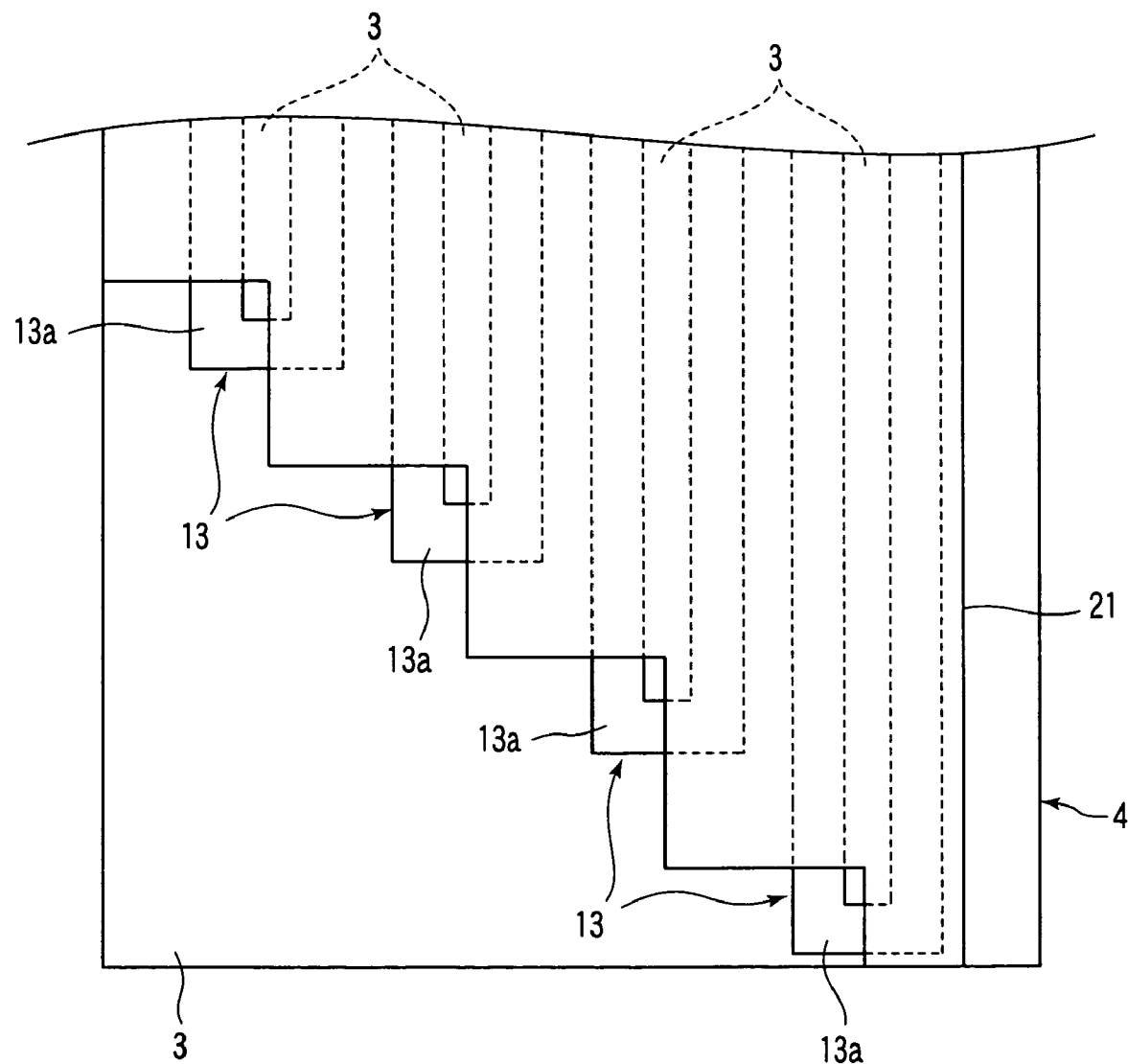
FIG. 27 is a plan view showing a method of manufacturing a semiconductor device in a sixth embodiment.

Next, a sixth embodiment of the present invention will be described with reference to FIG. 27. FIG. 27 is a plan view showing a method of manufacturing a semiconductor device in the present embodiment. It is to be noted that the same parts as those of the first to fifth embodiments are denoted with the same reference numerals, and detailed description thereof is omitted.

In the present embodiment, there will be described a method of forming a wiring pattern of an integrated circuit. In the method, a part of steps is different from the steps of the first to fifth embodiments. Specifically, there will be described a method of forming the wiring pattern of the integrated circuit using a resist pattern whose shape for use in forming a first wiring is different from that of the resist pattern used in the above-described second, fourth, and fifth embodiments.

As shown in FIG. 27, unlike the resist pattern 14 shown in FIG. 3, 9, or 17A, a resist pattern 21 for use in the present embodiment is not formed in such a manner that boundary portions between areas of side-wall leaving patterns 13 covered with the resist pattern 21 and areas of the respective side-wall leaving patterns 13 exposed from the resist pattern 21 are linearly arranged along a direction obliquely crossing a longitudinal direction of each side-wall leaving pattern 13 in the vicinity of a terminal end portion 13a which is one end portion of each side-wall leaving pattern 13. The resist pattern 21 is formed in such a manner that the boundary portions between the areas of the respective side-wall leaving patterns 13 covered with the resist pattern 21 and the areas of the respective side-wall leaving patterns 13 exposed from the resist pattern 21 obliquely cross the longitudinal direction or each side-wall leaving pattern 13 in the vicinity of the terminal end portion 13a which is one end portion of each side-wall leaving pattern 13 in a stepwise manner. That is, in the resist pattern 21, edge portions in the vicinity of the terminal end portions 13a of the respective side-wall leaving patterns 13 are formed into a staircase shape as shown in FIG. 27.

However, the resist pattern 21 is similar to resist pattern 14 shown in FIG. 3, 9, or 17A in that the edge portions in the vicinity of the terminal end portions 13a of the respective side-wall leaving patterns 13 are displaced from one another along the longitudinal direction of each side-wall leaving pattern 13 so that the boundary portions between the areas of the respective side-wall leaving patterns 13 covered with the resist pattern 21 and the areas of the respective side-wall leaving patterns 13 exposed from the resist pattern 21 do not overlap with each other in a direction crossing the longitudinal direction of each side-wall leaving pattern 13 at right angles.

As described above, according to the sixth embodiment, effects similar to those of the first to fifth embodiments can be obtained.

Seventh Embodiment

Figure 28:
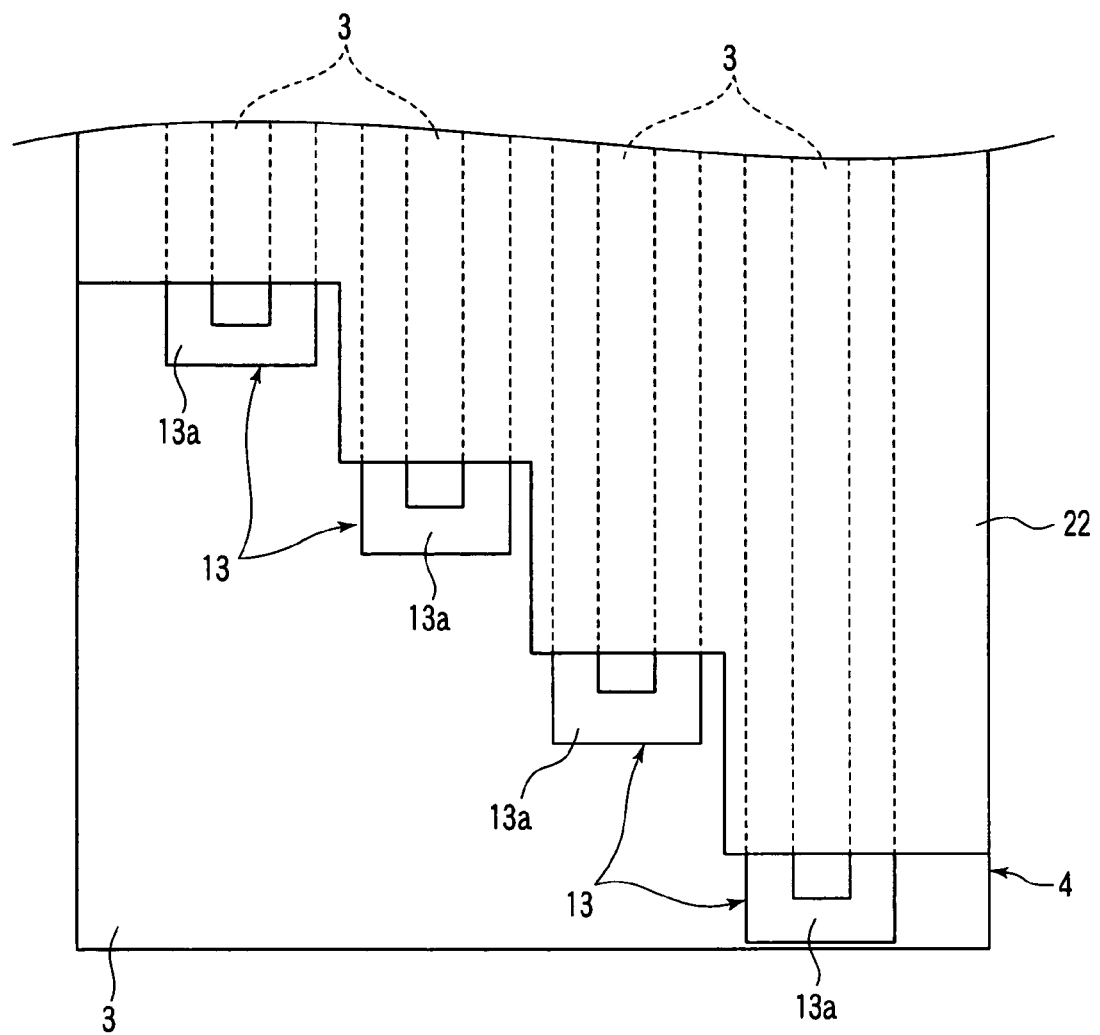
FIG. 28 is a plan view showing a method of manufacturing a semiconductor device in a seventh embodiment.

Next, a seventh embodiment of the present invention will be described with reference to FIG. 28. FIG. 28 is a plan view showing a method of manufacturing a semiconductor device in the present embodiment. It is to be noted that the same parts as those of the first to sixth embodiments are denoted with the same reference numerals, and detailed description thereof is omitted.

In the present embodiment, there will be described a method of forming a wiring pattern of an integrated circuit using a resist pattern whose shape is different from that of the resist pattern used in the above-described second, fourth, and fifth embodiments.

As shown in FIG. 28, unlike the resist pattern 14 shown in FIG. 3, 9, or 17A, a resist pattern 22 for use in the present embodiment is not formed in such a manner that boundary portions between areas of side-wall leaving patterns 13 covered with the resist pattern 22 and areas of the respective side-wall leaving patterns 13 exposed from the resist pattern 22 are linearly arranged along a direction obliquely crossing a longitudinal direction of each side-wall leaving pattern 13 in the vicinity of a terminal end portion 13a which is one end portion of each side-wall leaving pattern 13. The resist pattern 22 is formed in such a manner that the boundary portions between the areas of the respective side-wall leaving patterns 13 covered with the resist pattern 22 and the areas of the respective side-wall leaving patterns 13 exposed from the resist pattern 22 obliquely cross the longitudinal direction or each side-wall leaving pattern 13 in the vicinity of the terminal end portion 13a which is one end portion of each side-wall leaving pattern 13 in a stepwise manner. That is, in the resist pattern 22, edge portions in the vicinity of the terminal end portions 13a of the respective side-wall leaving patterns 13 are formed into a staircase shape as shown in FIG. 28.

Moreover, the shape of the resist pattern 22 of the present embodiment is slightly different from that of the resist pattern 21 of the sixth embodiment. The resist pattern 21 of the sixth embodiment is formed so that only corner portions of the terminal end portions 13a of the respective side-wall leaving patterns 13 are exposed. On the other hand, the resist pattern 22 of the present embodiment is formed such that almost all of the terminal end portions 13a of the respective side-wall leaving patterns 13 are exposed. However, in the same manner as in the resist pattern 21 of the sixth embodiment, the resist pattern 22 is similar to resist pattern 14 shown in FIG. 3, 9, or 17A in that the edge portions in the vicinity of the terminal end portions 13a of the respective side-wall leaving patterns 13 are displaced from one another along the longitudinal direction of each side-wall leaving pattern 13 so that the boundary portions between the areas of the respective side-wall leaving patterns 13 covered with the resist pattern 22 and the areas of the respective side-wall leaving patterns 13 exposed from the resist pattern 22 do not overlap with each other in a direction crossing the longitudinal direction of each side-wall leaving pattern 13 at right angles.

As described above, according to the seventh embodiment, effects similar to those of the first to sixth embodiments can be obtained.

Eighth Embodiment

Figure 30:
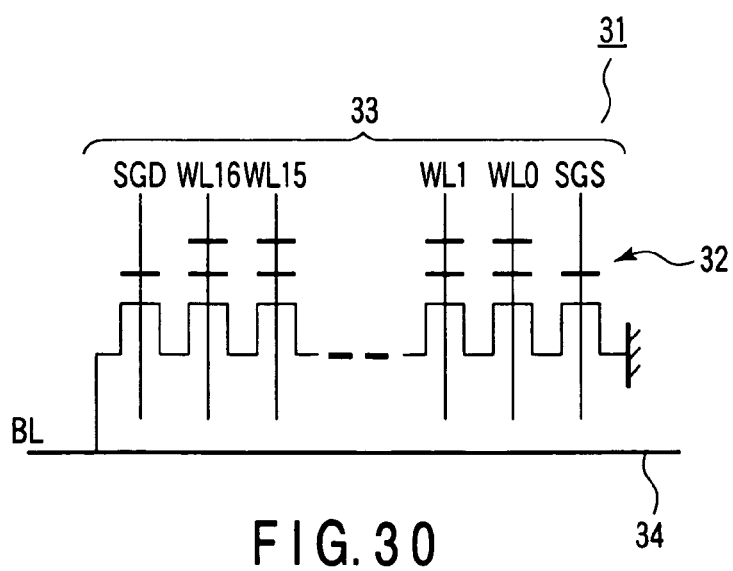
FIG. 30 is a diagram schematically a simplified circuit composition of the semiconductor device in the eighth embodiment.

Next, an eighth embodiment of the present invention will be described with reference to FIGS. 29A to 30. FIGS. 29A and 29B are a plan view and a step sectional view showing a method of manufacturing a semiconductor device in the present embodiment. FIG. 30 is a diagram schematically showing a simplified circuit composition of the semiconductor device in the present embodiment. It is to be noted that the same parts as that of the first to seventh embodiments are denoted with the same reference numerals, and detailed description thereof is omitted.

In the present embodiment, there will be described a technology to manufacture a semiconductor device including a transistor by applying any of the first to seventh embodiments. To be more specific, there will be described a technology to manufacture a NAND type flash memory by applying any of the first to seventh embodiments.

As shown in FIGS. 29A, 29B, and 30, the semiconductor device of the present embodiment is a NAND type flash memory 31. In this flash memory 31, each first wiring 3 is formed as a first gate layer 33 of a transistor 32. Each third wiring 15 is provided above an activated area pattern 34, and formed as a first metal wiring layer 35 electrically connected to each first gate layer 33. Each first metal wiring layer 35 composes a bit line (not shown) of the transistor 32. Needless to say, each first gate layer 33 is electrically connected to each first metal wiring layer 35 via each first contact plug 6. It is to be noted that FIG. 29B is a sectional view taken along broken line X-Y of FIG. 29A.

As described above, effects similar to those of the first to seventh embodiments can be obtained. It is possible to manufacture the NAND type flash memory 31 sufficiently adaptable to further miniaturization, high integration, and compactification by applying any of the first to seventh embodiments.

It is to be noted that according to the present invention, the semiconductor and the method of manufacturing the device are not limited to the first to eighth embodiments. A part of the compositions or manufacturing steps may be changed to various settings, or various settings may be appropriately combined for use in implementation without departing from the scope of the present invention.

For example, the resist pattern 8 shown in FIG. 12A and the side-wall leaving pattern 13 shown in FIG. 15A do not have to be necessarily formed in such a manner that the patterns lengthen or shorten in order along the direction in which they are arranged. The respective resist patterns 8 and side-wall leaving patterns 13 may be formed so that lengths of the patterns are adapted to the length of the longest pattern. In this case, the respective resist pattern 8 and side-wall leaving patterns 13 formed into uniform lengths are subjected to an etching treatment using the resist pattern 14 shown in FIG. 17A. Accordingly, a plurality of first wirings 3 can be finally obtained which are composed of the patterns similar to those of the fourth embodiment. This also applies to not only the first wirings 3 but also the second to fourth wirings 5, 15, and 16.

Moreover, in the semiconductor device of the present invention, all of inner wirings do not have to be formed by the method of manufacturing the semiconductor device in the present invention. That is, in the semiconductor device of the present invention, all of the inner wirings do not have to be formed into the above-described wiring patterns of the present invention. In the semiconductor device of the present invention, a part of the inner wirings may include at least a plurality of first wirings 3.

Furthermore, in the semiconductor device of the present invention, all of the inner wirings do not have to be formed into the above-described single-layer structure or double-layer structure including the lower and upper layer wirings. Two or more layers of the respective third and fourth wirings 15, 16 may be drawn out on the upper layer of the respective wirings 3, 5 to compose a so-called multilayered wiring structure.

In addition, the second wirings 5, the third wirings 15, and the fourth wirings 16 do not have to be necessarily provided. A plurality of first wirings 3 composed of at least the above-described patterns may be provided. For example, in a case where the only first wirings 3 are formed on the substrate 4 as described in the third embodiment, the tip portions of the wirings from the respective first contact plugs 6 do not have to be formed. Additionally, the tip portion area of the substrate 4 from the terminal end portion 3a of each first wiring 3 (each first contact plug 6) can be omitted. In a case where the first to fourth wirings 3, 5, 15, and 16 are provided on the substrate 4 by, for example, the method of the second embodiment, there is hardly a possibility that the useless space is formed on the substrate 4. In consequence, according to the present invention, the spaces on the substrate 4 and in the semiconductor device 1 can be appropriately effectively utilized in accordance with the wiring or circuit pattern to be formed so that further miniaturization, high integration, and compactification of the semiconductor device 1 can be achieved.

Moreover, the respective first and third wirings 3 and 15, and the respective second and fourth wirings 5 and 16 do not have to be necessarily provided to cross one another at right angles. As to the respective first and third wirings 3 and 15, and the respective second and fourth wirings 5 and 16, a part of wirings may be provided crossing each other at right angles. Similarly, as to the respective first and second wirings 3 and 5, and the respective third and fourth wirings 15 and 16, all of them do not have to necessarily face each other or extend toward the opposite directions by 180°. As to the respective first and second wirings 3 and 5, and the respective third and fourth wirings 15 and 16, a part of the wirings may be provided facing each other or extending toward the opposite directions by 1800. As to the respective first and second wirings 3 and 5, and the respective third and fourth wirings 15 and 16, all of them do not have to necessarily face each other or the number of the wirings do not have to be equal. Similarly, as to the respective first and third wirings 3 and 15, and the respective second and fourth wirings 5 and 16, all of them do not have to necessarily face each other or the number of the wirings do not have to be equal. For example, the second wirings 5 may be provided corresponding to a part of the respective first wirings 3. Alternatively, the third wirings 15 may be provided corresponding to a part of the respective first wirings 3. In consequence, the respective first to fourth wirings 3, 5, 15, 16 may be appropriately provided in accordance with the directions in which the respective wirings are drawn out or the number of the wirings to be drawn.

Moreover, as to the respective contact plugs 6, 7 provided on the first and second wirings 3, 5, one contact plug does not have to be necessarily provided. A plurality of contact plugs may be provided on the first or second wirings 3 or 5 including the start end portions or intermediate portions of the first or second wirings 3 or 5 as long as each of the contact plugs 6, 7 is provided on at least the terminal end portion 3a or 5a of the first or second wiring 3 or 5. Needless to say, the number of the respective contact plugs 6 or 7 provided on the first or second wirings 3 or 5 may differ with each wiring. Furthermore, needless to say, the respective contact plugs 6, 7 may not have to be provided on the first wiring 3 which is not electrically connected to the third wiring 15 or the second wiring 5 which is not electrically connected to the fourth wiring 16.

Furthermore, in FIGS. 1 to 29B referred to in the above-described first to seventh embodiments, to facilitate the viewing of the drawings, barrier metal films around the first to fourth wirings 3, 5, 15, and 16 and the first and second contact plugs 6, 7 are omitted from the drawings. In the actually manufactured semiconductor device, needless to say, the first to fourth wirings 3, 5, 15, and 16 and the first and second contact plugs 6, 7 may be covered with the barrier metal films composed of appropriate materials in accordance with the materials of the wirings and contact plugs.

Furthermore, the semiconductor device manufactured by the method of manufacturing the semiconductor device of the present invention is not limited to the LSI or the NAND type flash memory. The method of manufacturing the semiconductor device of the present invention may be applied to various processes of manufacturing the semiconductor device in addition to, for example, a logic device, the LSI, and various memories. Needless to say, the semiconductor device of the present invention is applicable to various semiconductor devices other than the LSI or various memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   first wirings having various lengths and provided in a layer on a substrate and being lined up, adjacent one-end portions of the first wirings being arranged in positions displaced from one another in an extending direction of the first wirings;
   second wirings which are connected to the first wirings, respectively, and which are provided in another layer on the substrate to extend in a direction intersecting the extending direction of the first wirings;
   first contact portions which electrically connect the first wirings and the second wirings, and which are provided at the one-end portions of the first wirings, respectively;
   third wirings lined with the first wirings in which the first wirings provided at one-end portion of each third wiring being provided apart from and opposite to the one-end portion of the respective one of the first wirings; and
   fourth wirings which are connected to the third wirings, respectively, and which are provided in the another layer on the substrate to extend in a direction intersecting the extending direction of the third wirings.

2. The device according to claim 1, wherein the first wirings are formed so that the respective one-end portions of the respective first wirings are linearly lined up along a direction obliquely crossing a longitudinal direction of the respective first wirings.

3. The device according to claim 1,
wherein the one-end portions of the adjacent third wirings are displaced from one another in an extending direction of the third wirings.

4. The device according to claim 3, wherein each third wiring is extended along a direction parallel to the extending direction of the first wiring.

5. The device according to claim 3, wherein the third wirings are formed so that the respective one-end portions of the respective third wirings are linearly lined up along a direction obliquely crossing the extending direction of the third wirings.

6. The device according to claim 3, further comprising:
second contact portions at least one of which is provided on each one-end portion of the third wirings and which electrically connect the third wirings to respective fourth wirings.

7. The device according to claim 3, wherein the second wirings are provided in an upper layer of the layer,
the device further comprising:
second contact portions at least one of which is provided on each one-end portion of the third wirings and which electrically connect the third wirings to the respective fourth wirings.

8. The device according to claim 7, wherein each second wiring and each fourth wiring are provided in the same layer.

9. The device according to claim 7, wherein each of the first and third wirings is formed as a gate layer of a transistor, and each of the second and fourth wirings is formed as a metal wiring layer electrically connected to each gate layer.

10. The device according to claim 7, wherein the first to fourth wirings and the first and second contact portions compose a part of a NAND type flash memory, respectively.

* * * * *